(12) United States Patent
Lee et al.

(10) Patent No.: US 12,464,774 B2
(45) Date of Patent: Nov. 4, 2025

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventors: Kai-Hsuan Lee, Hsinchu (TW); Shih-Che Lin, Hsinchu (TW); Po-Yu Huang, Hsinchu (TW); Shih-Chieh Wu, Hsinchu (TW); I-Wen Wu, Hsinchu (TW); Chen-Ming Lee, Taoyuan (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 636 days.

(21) Appl. No.: 17/678,288

(22) Filed: Feb. 23, 2022

(65) Prior Publication Data

US 2023/0268411 A1    Aug. 24, 2023

(51) Int. Cl.
*H10D 30/67*     (2025.01)
*H10D 30/01*     (2025.01)
(Continued)

(52) U.S. Cl.
CPC ....... *H10D 30/6735* (2025.01); *H10D 30/031* (2025.01); *H10D 30/6713* (2025.01);
(Continued)

(58) Field of Classification Search
CPC ....... H01L 29/42392; H01L 21/823412; H01L 21/823418; H01L 21/823468; H01L 29/0665; H01L 29/66545; H01L 29/66742; H01L 29/78618; H01L 29/78696; H10D 30/6735; H10D 30/031; H10D 30/6713; H10D 30/6757; H10D 62/118; H10D 64/017; H10D 84/0128; H10D 84/013; H10D 84/0147; H10D 84/038; H10D 30/797; H10D 30/014; H10D 30/43; H10D 62/822; H10D 62/116; H10D 62/121; H10D 64/015; H10D 64/514; H10D 64/679; H10D 84/0151; B82Y 10/00
See application file for complete search history.

(56) References Cited

U.S. PATENT DOCUMENTS 9,209,247 B2   12/2015   Colinge et al.
9,236,267 B2   1/2016    De et al.
(Continued)

*Primary Examiner* — Fernando L Toledo
*Assistant Examiner* — Ashley Nicole Blackwell
(74) *Attorney, Agent, or Firm* — Birch, Stewart, Kolasch & Birch, LLP

(57) ABSTRACT

A semiconductor structure includes a substrate, nanostructures over the substrate, and a gate structure wrapping around the nanostructures. The gate structure includes a gate dielectric layer and a gate electrode wrapping around the gate dielectric layer. The semiconductor structure further includes a source/drain feature in contact with the nanostructures, a contact etch stop layer over the source/drain feature, and a seal layer over the air spacer and the gate structure, and on a sidewall of the contact etch stop layer. The contact etch stop layer is separated from the gate structure by an air spacer.

20 Claims, 28 Drawing Sheets

(51) Int. Cl.
*H10D 62/10* (2025.01)
*H10D 64/01* (2025.01)
*H10D 84/01* (2025.01)
*H10D 84/03* (2025.01)

(52) U.S. Cl.
CPC ....... *H10D 30/6757* (2025.01); *H10D 62/118* (2025.01); *H10D 64/017* (2025.01); *H10D 84/0128* (2025.01); *H10D 84/013* (2025.01); *H10D 84/0147* (2025.01); *H10D 84/038* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2010/0025775 A1* | 2/2010 | Giles ................. H10D 64/667 257/E21.409 |
| 2017/0141207 A1* | 5/2017 | Cheng ................ H01L 23/5329 |
| 2019/0172927 A1* | 6/2019 | Jagannathan ........ H10D 62/116 |
| 2020/0168742 A1* | 5/2020 | Wang ................ H01L 29/66742 |
| 2021/0098634 A1* | 4/2021 | Chung ................ H01L 29/0673 |
| 2021/0242324 A1* | 8/2021 | Yao .................... H01L 29/4991 |

* cited by examiner

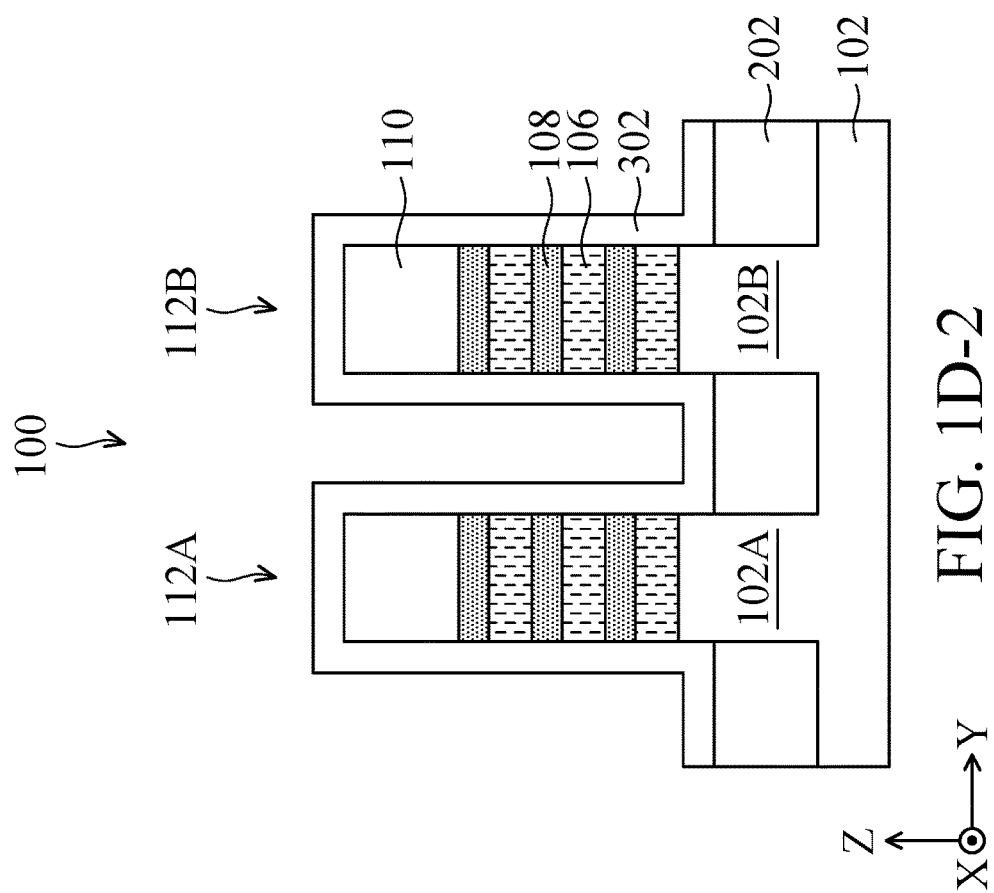
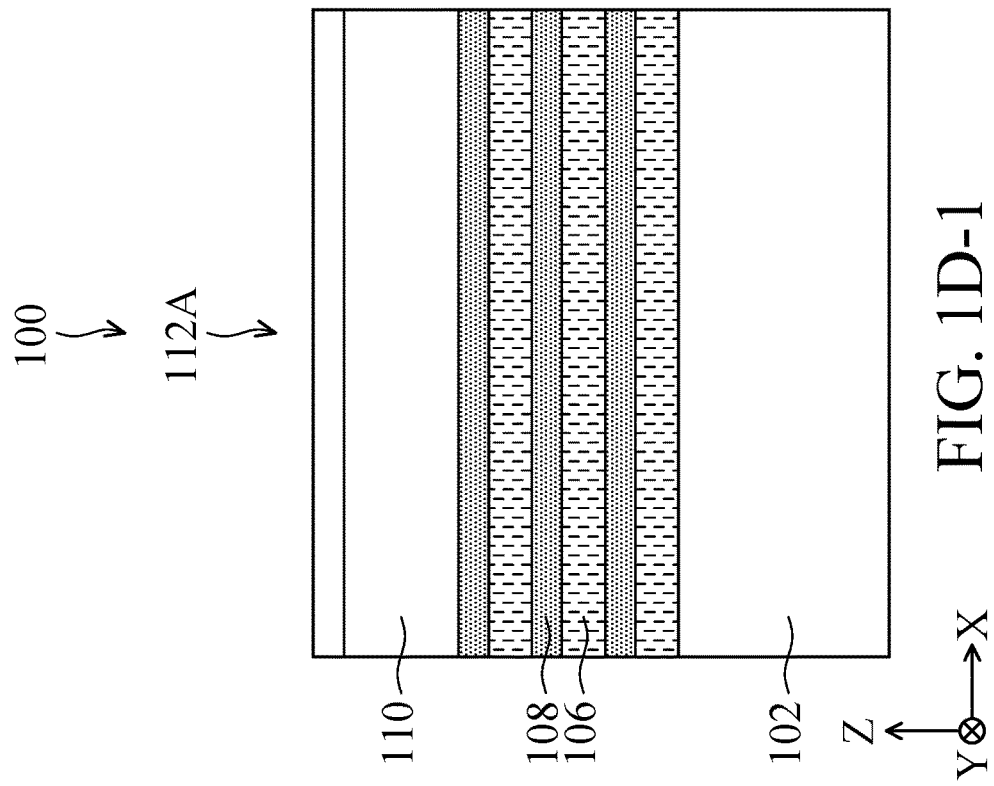

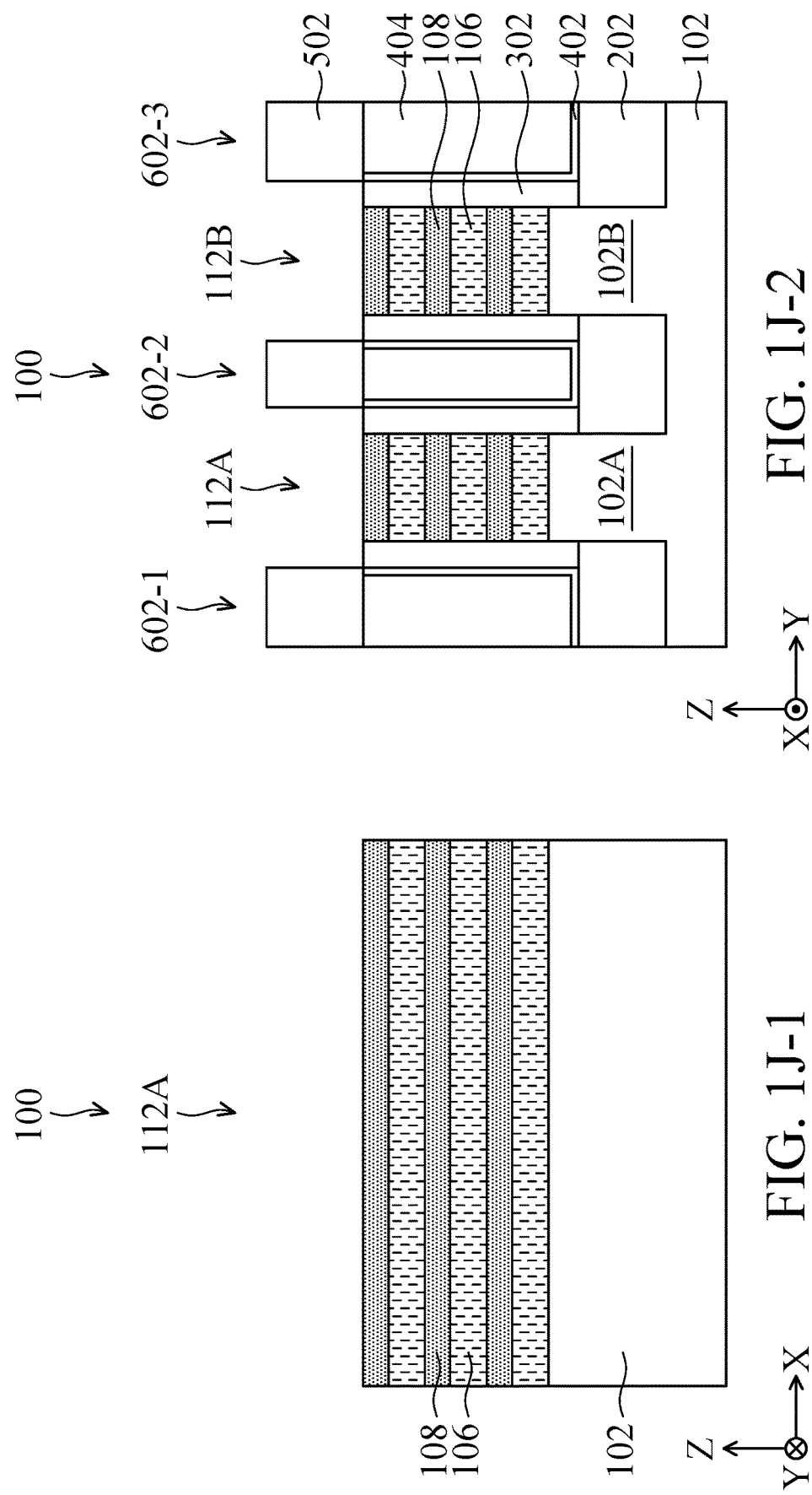

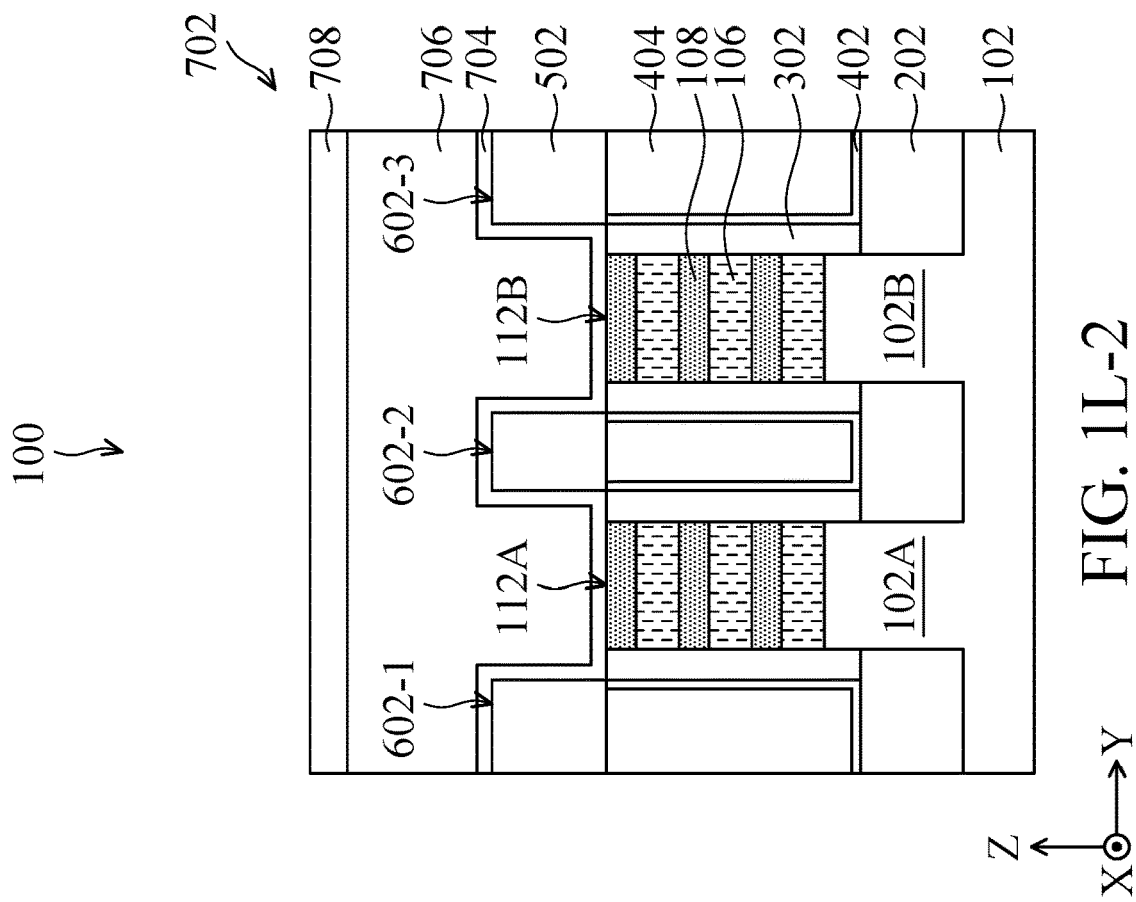
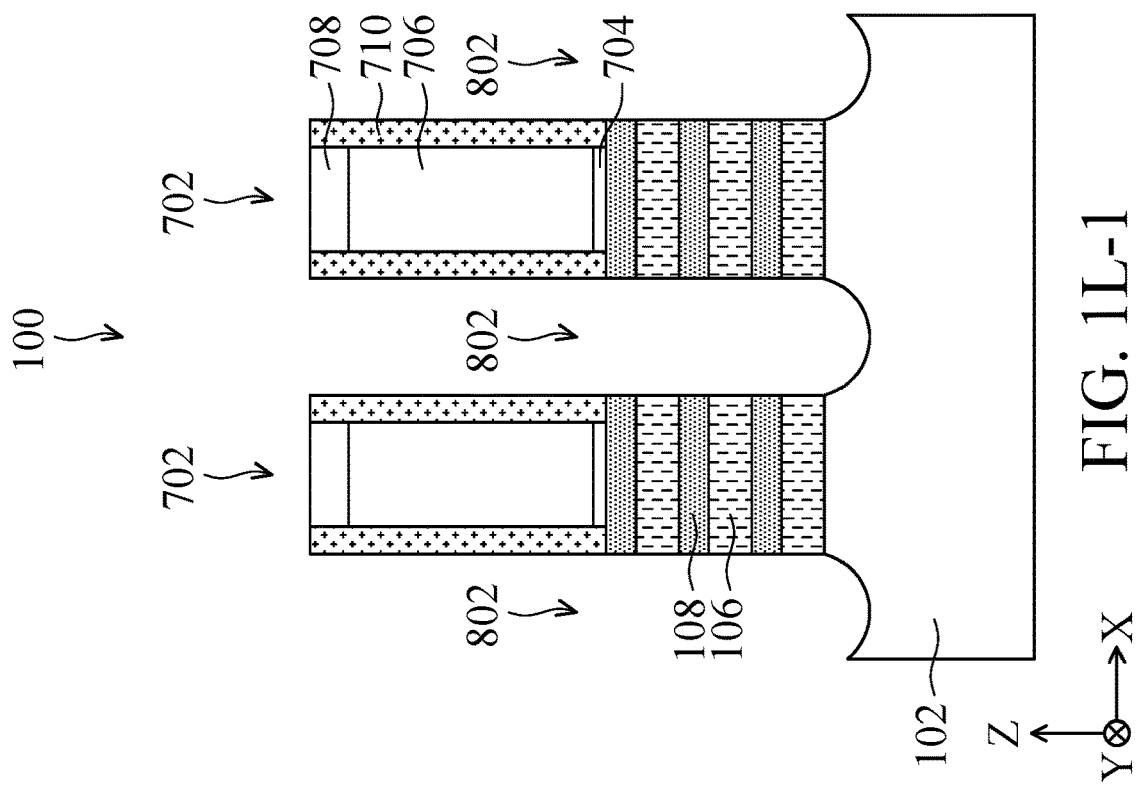
FIG. 1L-2
FIG. 1L-1

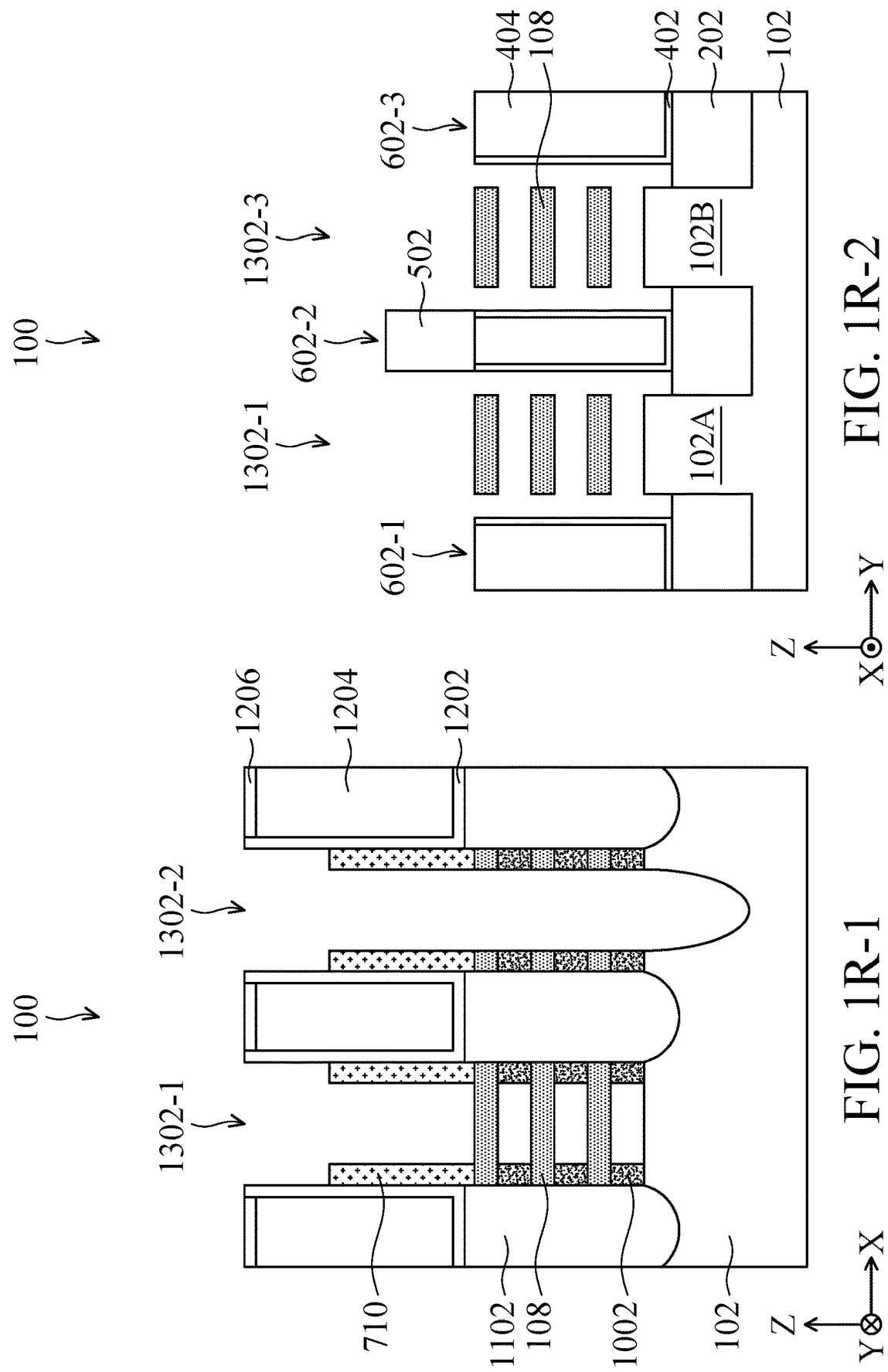

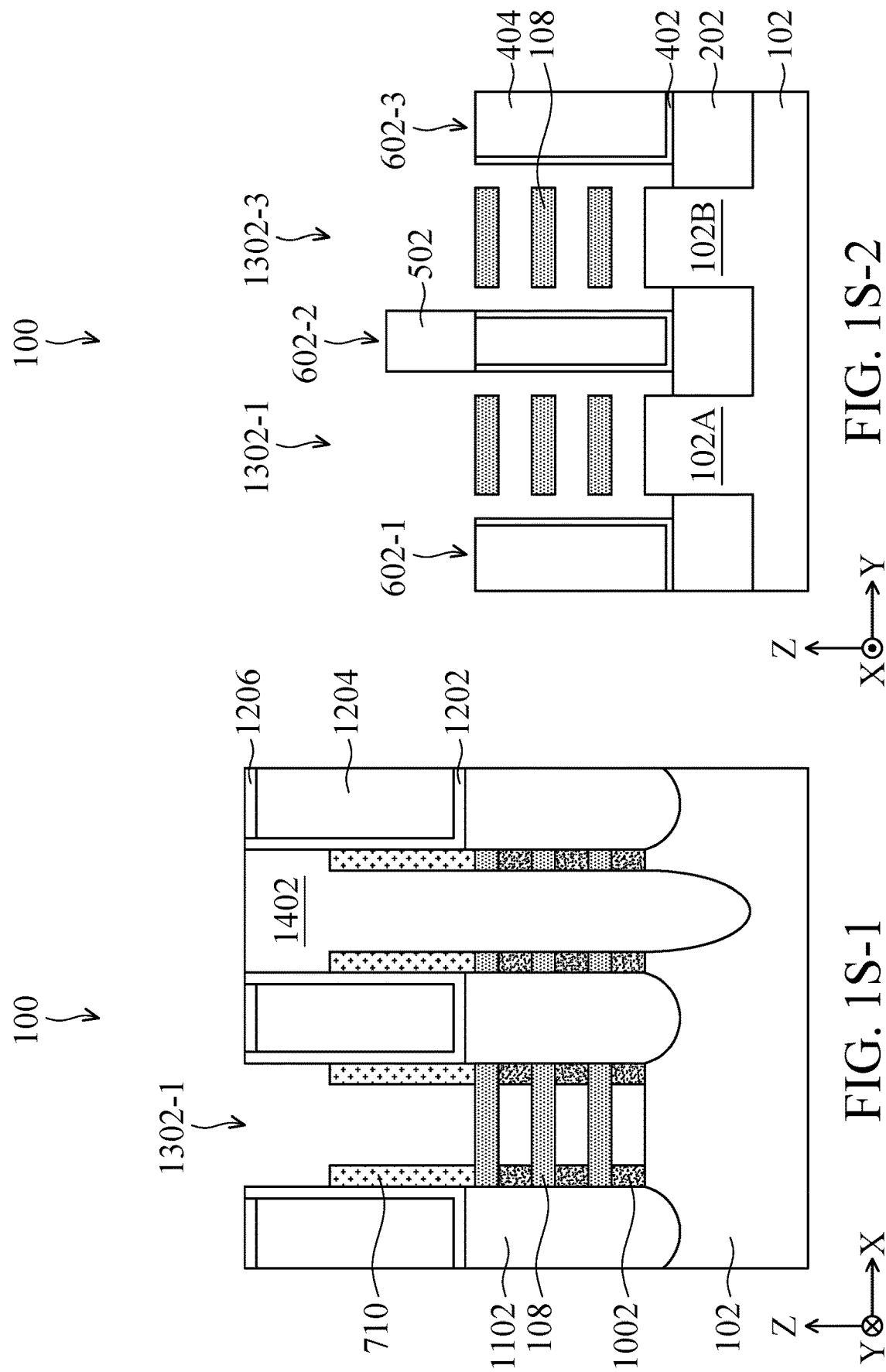

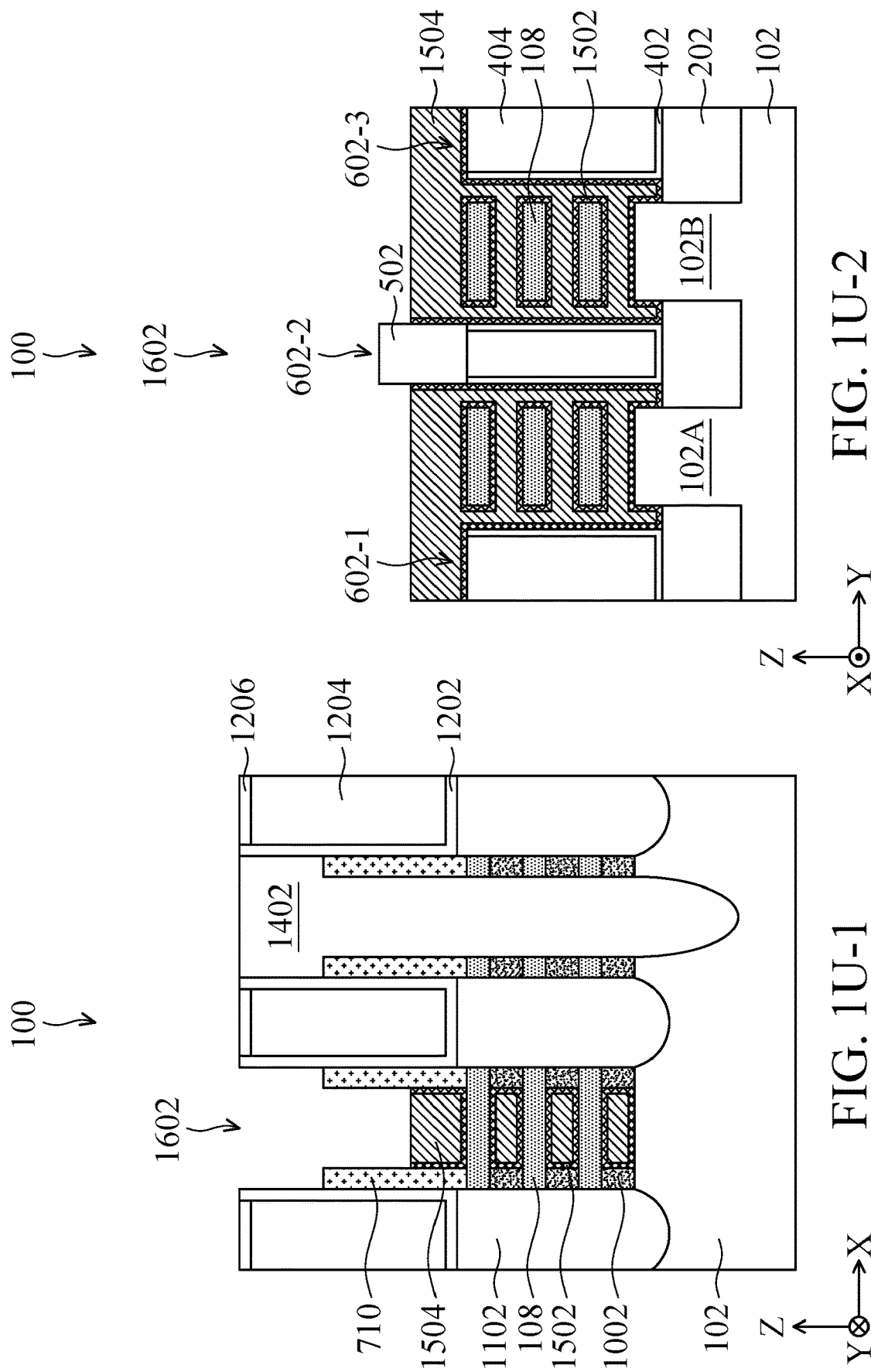

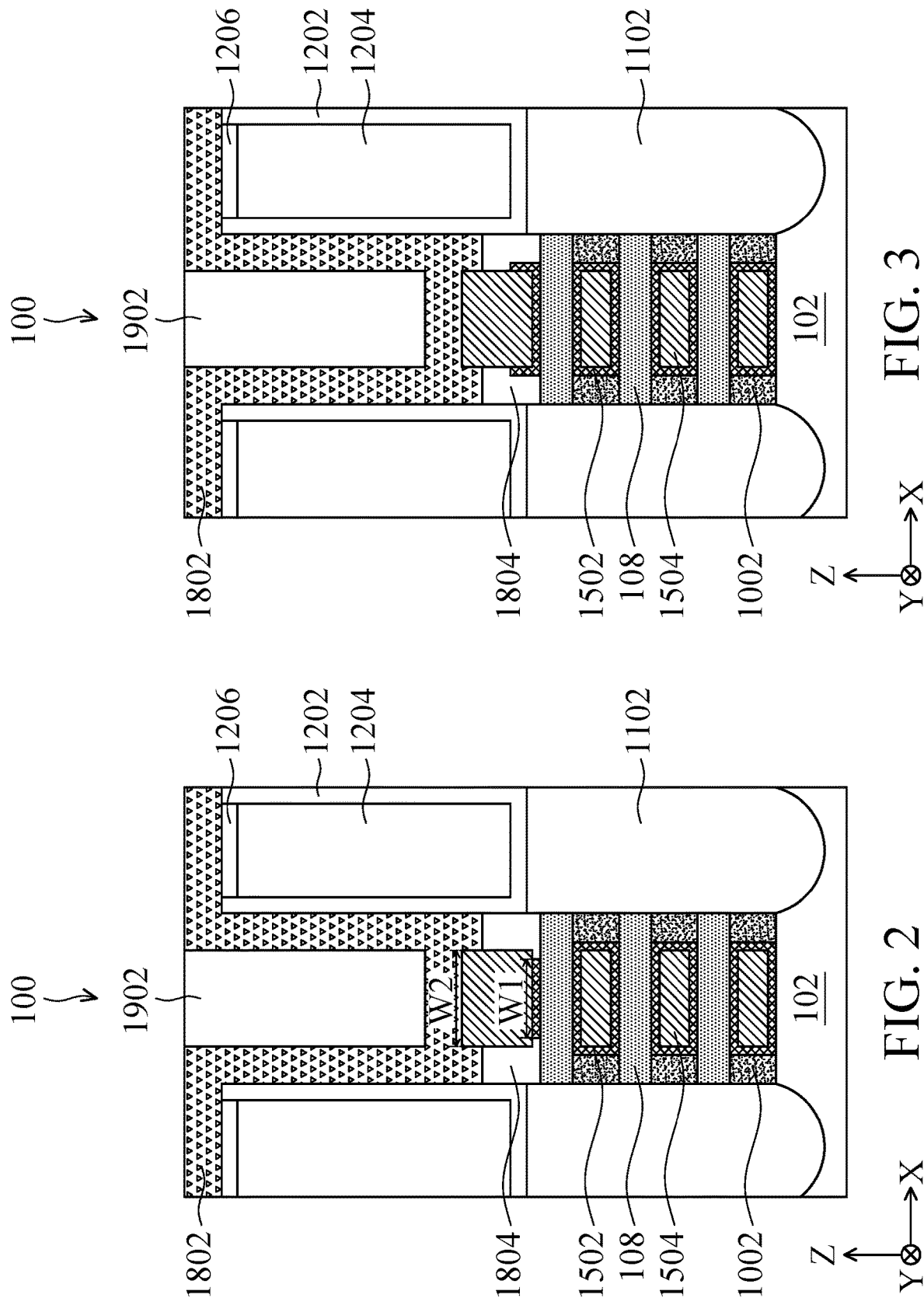

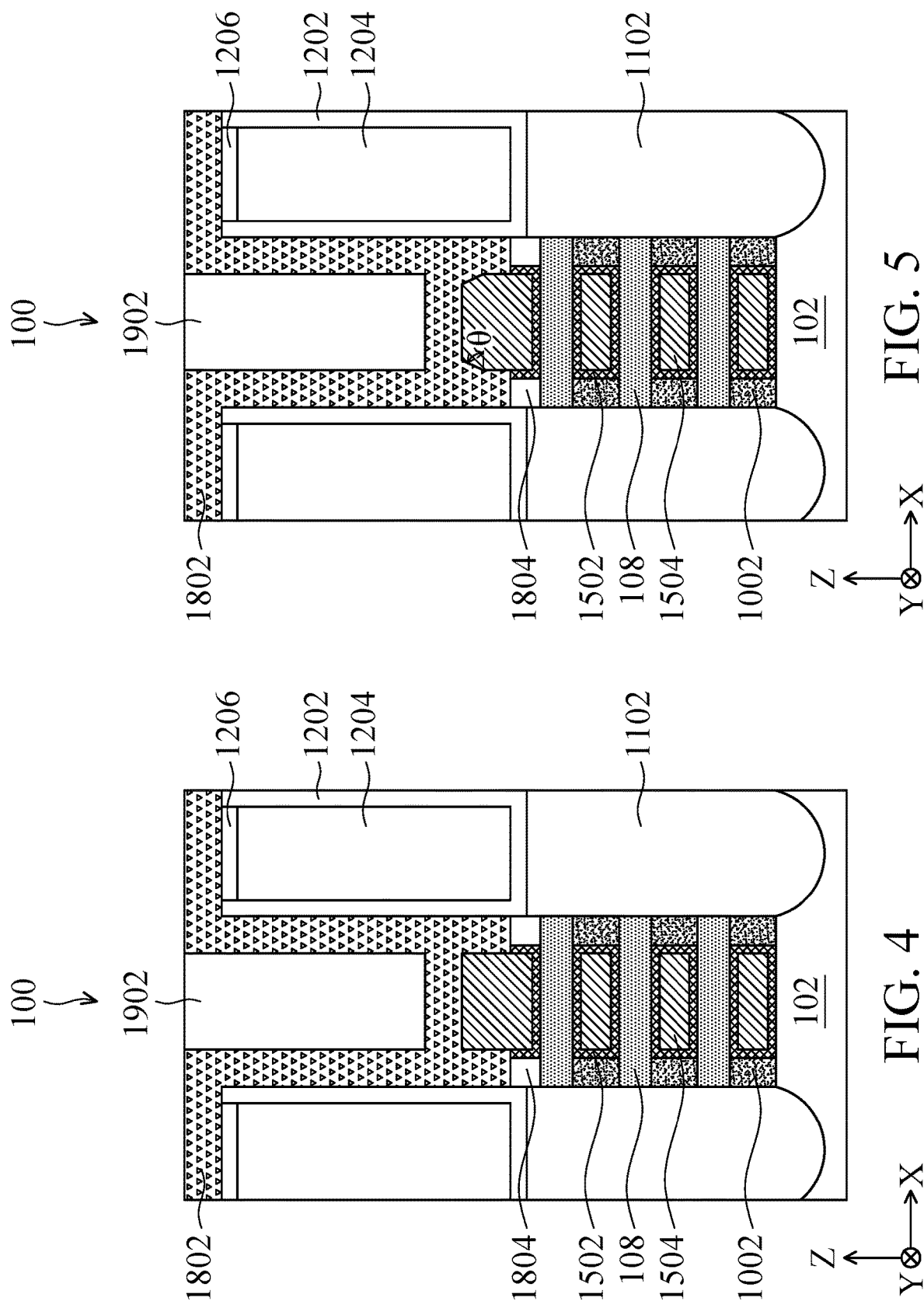

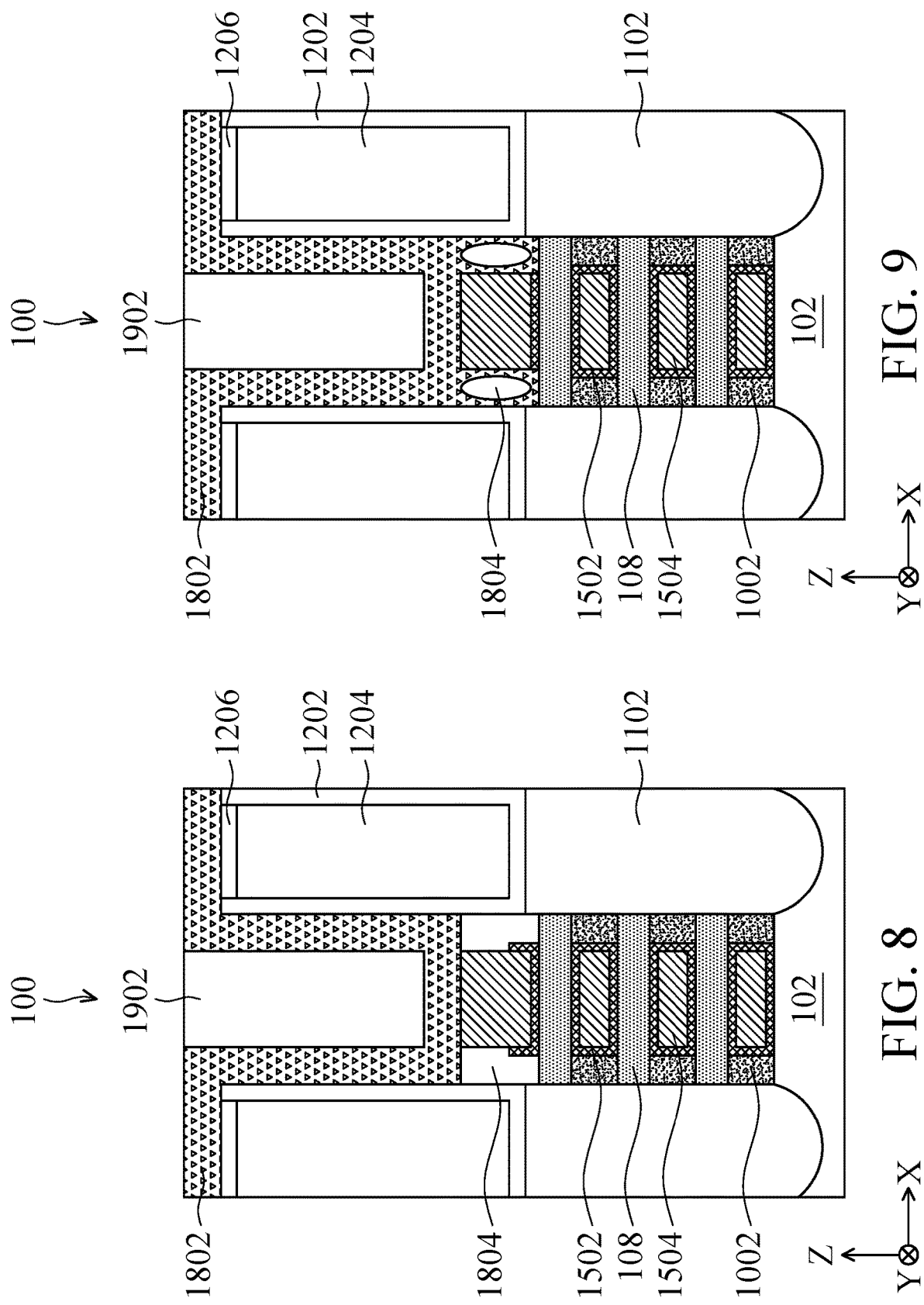

US 12,464,774 B2

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce the chip footprint while maintaining reasonable processing margins. However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1C-1, 1D-1, 1E-1, 1G-1, 1H-1, 1I-1, 1J-1, 1K-1, 1L-1, 1M-1 1N-1, 1O-1, 1P-1, 1Q-1 1R-1, 1S-1, 1T-1, 1U-1, 1V-1, 1W-1 and 1X-1 are cross-sectional views of an embodiment of a workpiece of the present disclosure constructed at various fabrication stages along line A-A' of FIG. 1B, in accordance with some embodiments.

FIGS. 1C-2, 1D-2, 1E-2, 1F-2, 1G-2, 1H-2, 1I-2, 1J-2, 1K-2, 1L-2, 1M-2, 1N-2, 1O-2, 1P-2, 1Q-2, 1R-2, 1S-2, 1T-2, 1U-2, 1V-2, 1W-2 and 1X-2 are cross-sectional views of an embodiment of a workpiece of the present disclosure constructed at various fabrication stages along line B-B' of FIG. 1B, in accordance with some embodiments.

FIGS. 2, 3, 4, 5, 6, 7, 8 and 9 are partial enlarged cross-sectional views of some alternative embodiments of the workpiece of FIG. 1X-1.

DETAILED DESCRIPTION

Figure 1A:
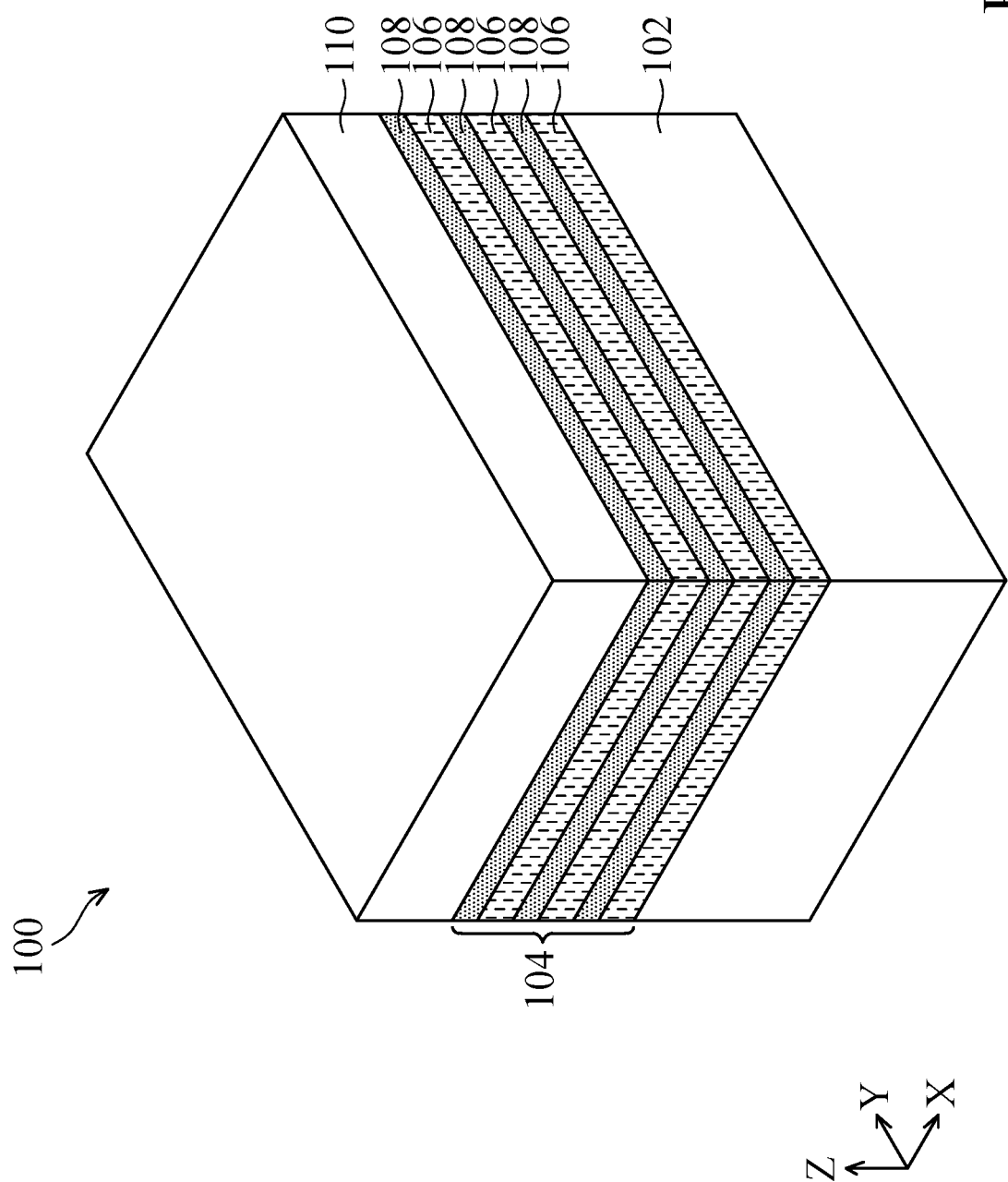
FIGS. 1A and 1B are isometric views of an embodiment of a workpiece of the present disclosure constructed at various fabrication stages, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as three-dimensional gate-all-around (GAA) FETs, in memory (e.g., SRAM) and/or standard logic cells of an integrated circuit (IC) structure. Generally, a GAA FET may include a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. Specifically, as GAA FETs continue to be scaled down, the effect of the parasitic capacitance in GAA FETs becomes greater, thereby decreasing performances of GAA FETs.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including voids between a gate structure and a contact etch stop layer for serving as gate spacers to decrease parasitic capacitance. The details of the structure and fabrication methods of the present disclosure are described below in conjunction with the accompanying drawings, which illustrate the process of making GAA transistor structures, according to some embodiments.

Referring to FIG. 1A, a workpiece 100 is provided. The workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type regions doped with a p-type dopant (i.e., boron (B)), for forming different types of devices. The doping the n-type wells and the p-type wells may he formed using ion implantation or thermal diffusion. In some embodiments, n-type wells have an n-type dopant concentration of about $5\times10^{16}$ cm$^{-3}$ to about $5\times10^{19}$ cm$^{-3}$, and p-type wells have a p-type dopant concentration of about $5\times10^{16}$ cm$^{-3}$ to about $5\times10^{19}$ cm$^{-3}$.

The stack 104 includes semiconductor layers 106 and 108, and the semiconductor layers 106 and 108 are alternating stacked in the Z-direction. In some, embodiments, the stack 104 has a thickness in a range from about 50 nm (nanometers) to about 60 nm. In other embodiments, the semiconductor layers 108 each have a thickness in a range from about 4 nm to about 8 nm. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers. In some embodiments, the semiconductor layers 106 and 108 are epitaxially grown over (on) the semiconductor substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104. It should be noted that three (3) layers of the semiconductor layers 106 and three (3) layers of the semiconductor layers 108 are alternately and vertically arranged (or stacked) as shown in FIG. 3, which are for illustrative purposes only and not intended to be limiting beyond what is specifically recited in the claims. The number of layers depends on the desired number of channels members for the semiconductor device. In some embodiments, there may be from 2 to 10 semiconductor layers 106 alternating with 2 to 10 semiconductor layers 108 in the stack 104.

For patterning purposes, the workpiece 100 may also include a hard mask layer 110 over the stack 104. The hard mask layer 110 may be a single layer or a multilayer. In some embodiments, the hard mask layer 110 is a single layer and includes a silicon germanium layer. In some embodiments, the hard mask layer 110 is a multi-layer and includes a silicon nitride layer and a silicon oxide layer over the silicon nitride layer. In some other embodiments, the hard mask layer 110 is a multi-layer and includes a silicon germanium layer and a silicon layer over the silicon germanium layer.

Figure 1B:
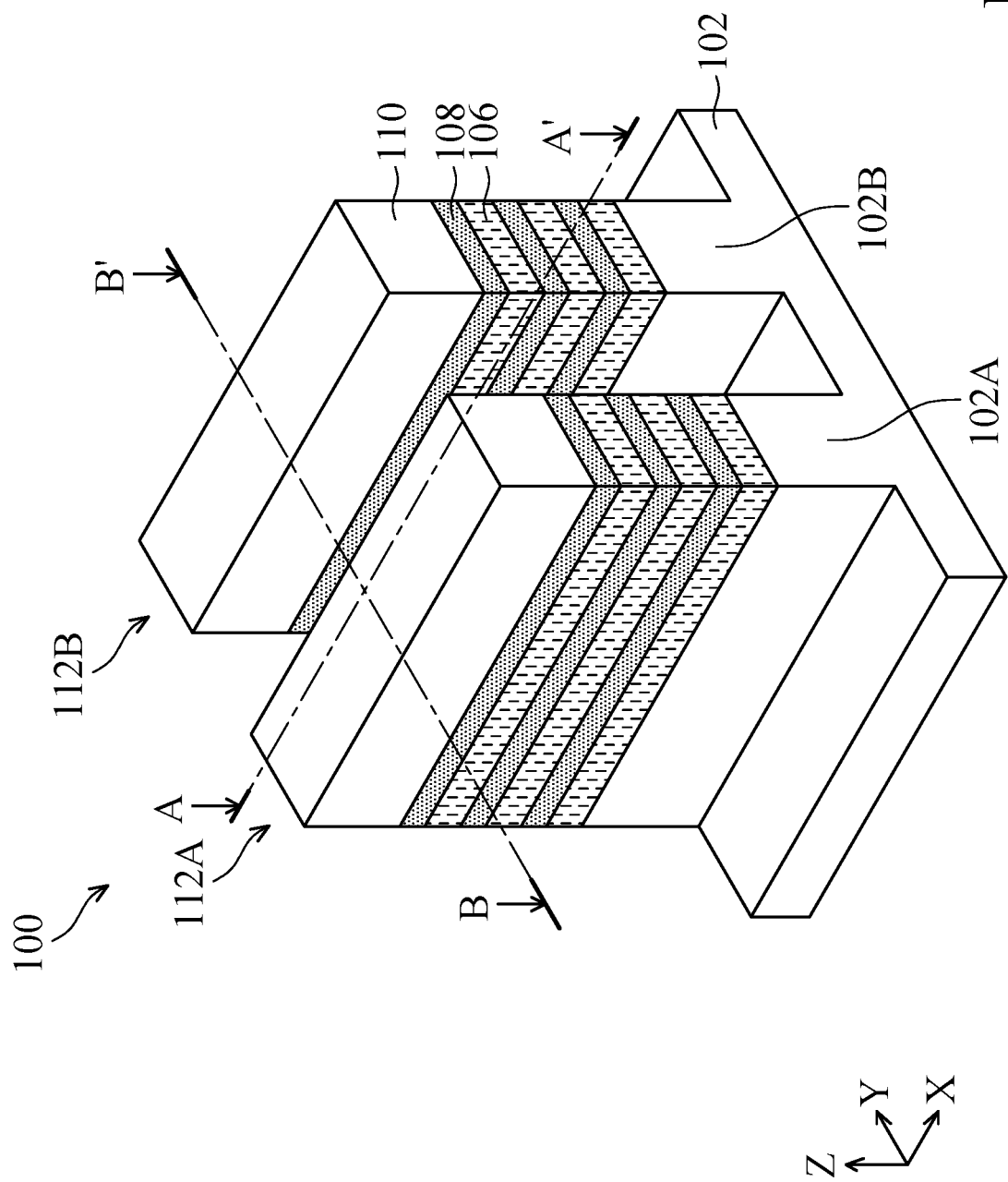

Referring to FIG. 1B, the substrate 102, the stack 104 and the hard mask layer 110 are then patterned to form fins 112A and 112B (may be collectively referred to as fins 112) over the substrate 102. As shown in FIG. 1B, each of the fins 112 includes a base portion (102A and 102B) formed from a portion of the substrate 102 and a stack portion formed from the stack 104 over the base portion. Each of the fins 112 extends lengthwise in the X-direction and extends vertically in the Z-direction over the substrate 102. In some embodiments, widths of the fins 112A and 112B along the Y-direction are the same. Although the two fins 112A and 112B are formed herein, more fins may be formed, such as three or more fins.

The fins 112A and 112B may be patterned using suitable processes including double-patterning or multi-patterning processes. For example, in some embodiment, a material layer is formed over a substrate and patterned using a photolithography process. Spacers are formed alongside the patterned material layer using a self-aligned process. The material layer is then removed, and the remaining spacers, or mandrels, may then he used to pattern the fins 112A and 112B by etching the stack 104 and the substrate 102. The etching process may include dry etching, wet etching, reactive ion etching (RIE) and/or other suitable processes.

Figures 1, 1C, 2:
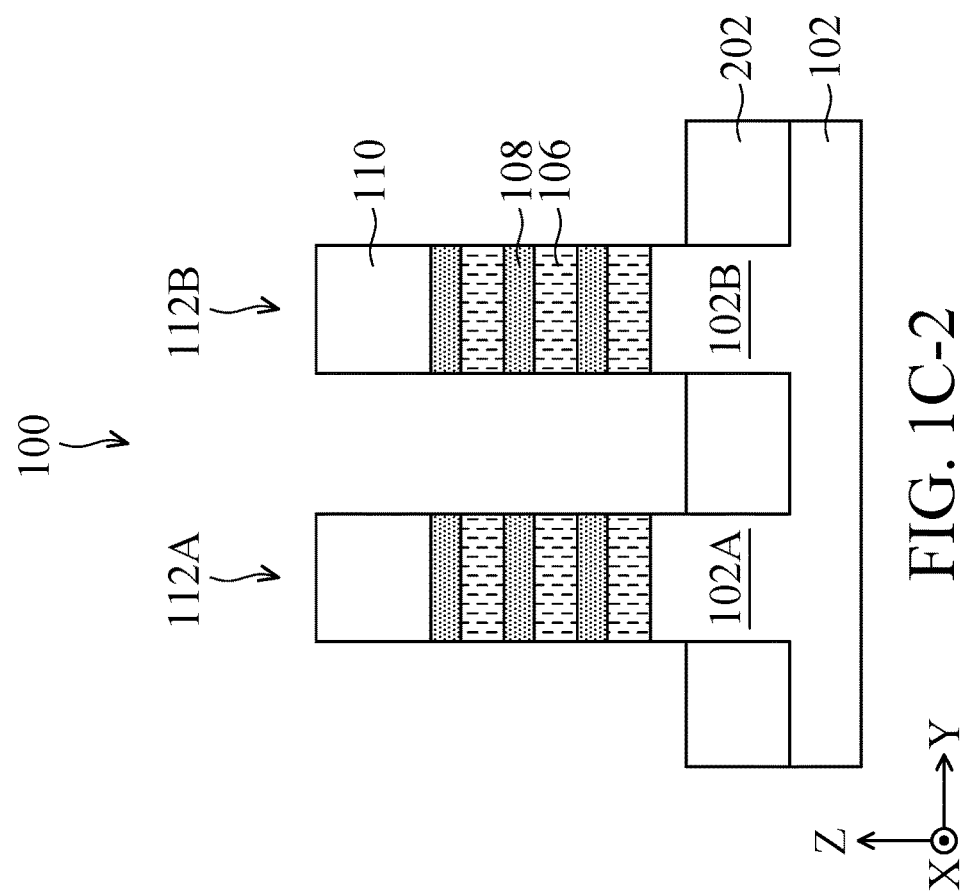
Figures 1, 1C:
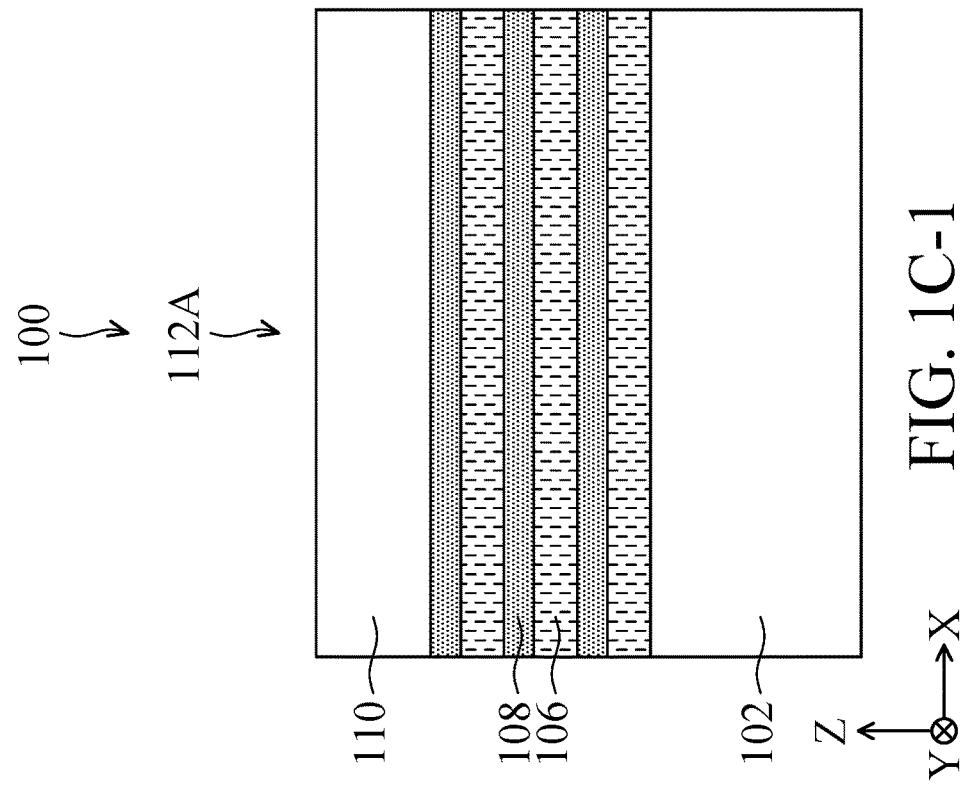

Referring to FIGS. 1C-1 and 1C-2, isolation structures 202 are formed. After the fins 112 are formed, the isolation structures 202 are formed between neighboring fins 112. In some aspects, the isolation structure 202 extending in the X-direction (not shown) and arranged with the fins 112 in the Y-direction. In some other aspects, the isolation structure 104 is formed around the fins 109. The isolation structures 202 may also be referred to as shallow trench isolation (STI) feature. In some embodiments, a dielectric material for the isolation structures 202 is first deposited over the workpiece 100, filling the trenches between fins 112 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD, a subatmospheric CVD (SACVD), a flowable CVD (FCVD), an ALD, spin-on coating, and/or other suitable process. The deposited dielectric material is then thinned and planarized, for example by a chemical mechanical polishing (CMP) process, until top surfaces of the hard mask layer 110 is exposed (not shown). Referring then to FIGS. 1C-1 and 1C-2, the planarized dielectric material is further recessed by a dry etching process, a wet etching process, and/or a combination thereof to form the isolation structures 202. As shown in FIGS. 1C-1 and 1C-2, the stack portions of the fins 112 rise above the isolation structures 202 while the base portions are surrounded by the isolation structures 202. In other words, the top surface of the substrate 102 is higher than the top surfaces of the isolation structures 202.

Referring to FIGS. 1D-1 and 1D-2, a cladding layer 302 is formed on sidewalls of the fins 112 and sidewalls of the hard mask layer 110, and formed over the isolation structures 202 and the hard mask layer 110. In some embodiments, the cladding layer 302 may have a similar composition to that of the semiconductor layers 106. In some embodiments, the cladding layer 302 may be formed of silicon germanium (SiGe), just like the semiconductor layers 106. This common composition allows selective removal of the semiconductor layers 106 and the cladding layer 302 in a subsequent process (e.g., release process). In some embodiments, the formation of the cladding layer 302 may include conformally grow cladding material, as shown in FIG. 1D-2. In some embodiments, the cladding layer 302 may be deposited using CVD, ALD, or other suitable deposition method.

Figures 1, 1E, 2:
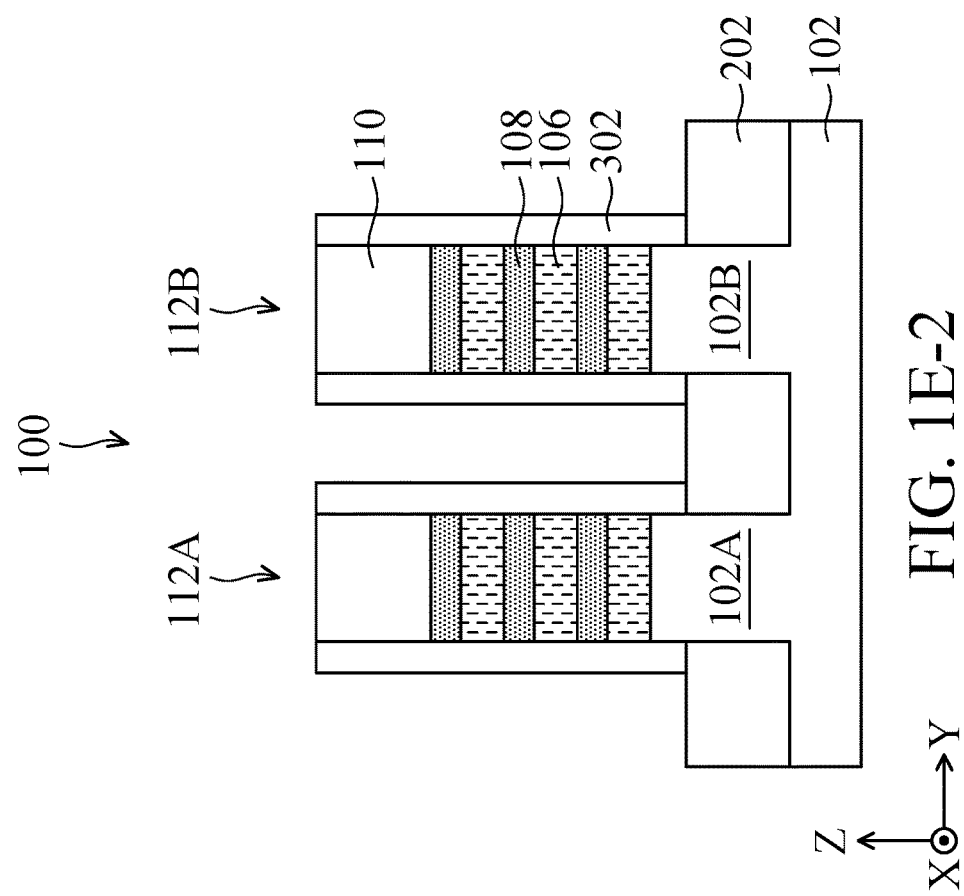
Figures 1, 1E:
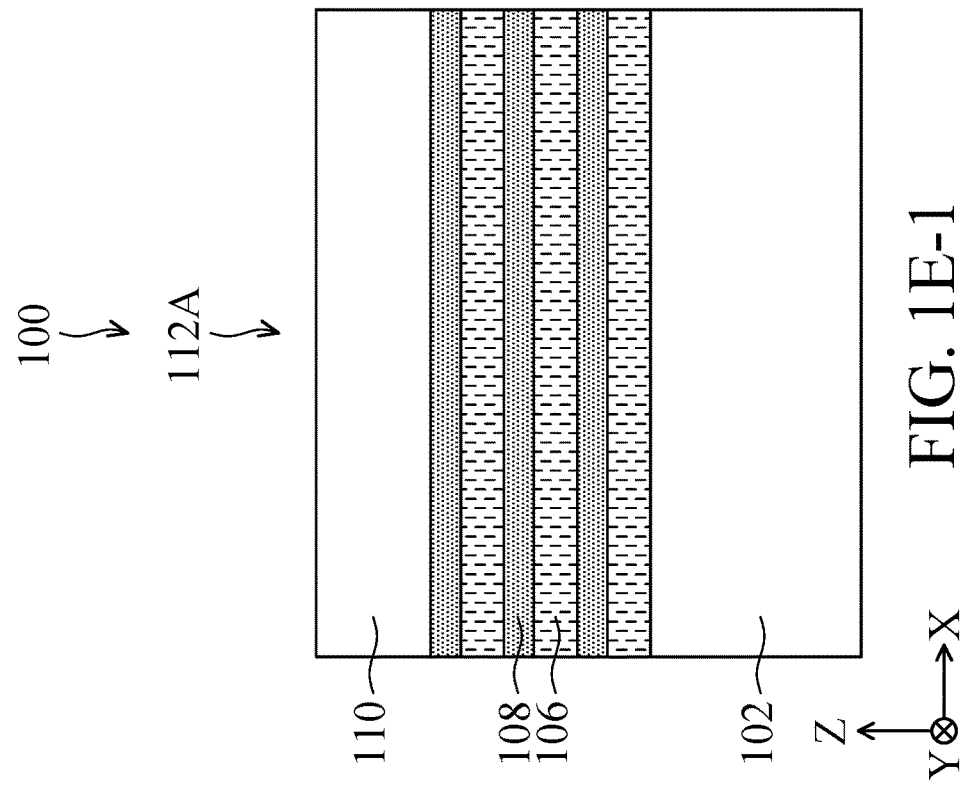

Referring to FIGS. 1E-1 and 1E-2, an etch process is performed to remove portions of the cladding layer 302 on top surfaces of the hard mask layer 110 over the fins 112A and 112B, and remove portions of the cladding layer 302 on the top surfaces of the isolation structures 202, so that the cladding layer 302 remains on the sidewalls of the fins 112A and 112B, and the sidewalls of the hard mask layer 110. The etch process may be a isotropic etch process, such as a dry etch process that includes use of plasma of hydrogen bromide (HBr), oxygen ($O_2$), chlorine ($Cl_2$), or mixtures thereof. As shown in FIG. 1E-2, the top surfaces of the hard mask layer 110 over the fins 114A and 114B and the top surfaces of the isolation structures 202 are exposed after the etch process.

Figures 1, 1F, 2:
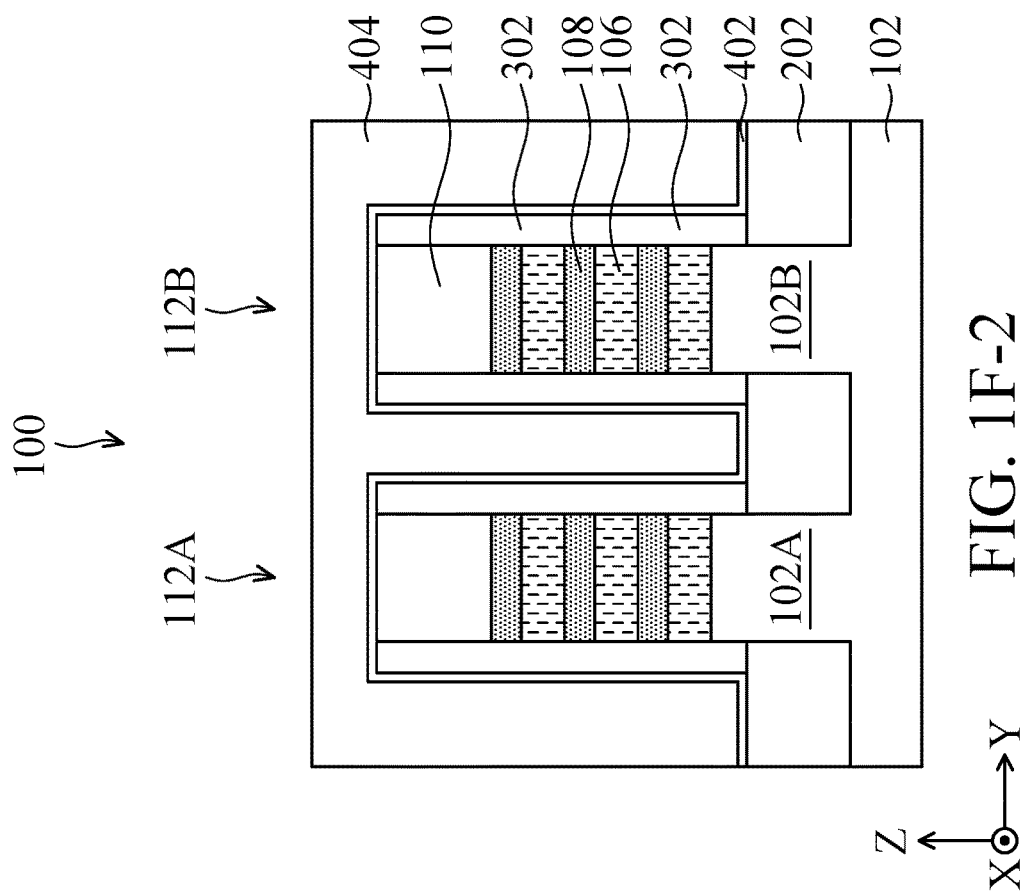
Figures 1, 1F:
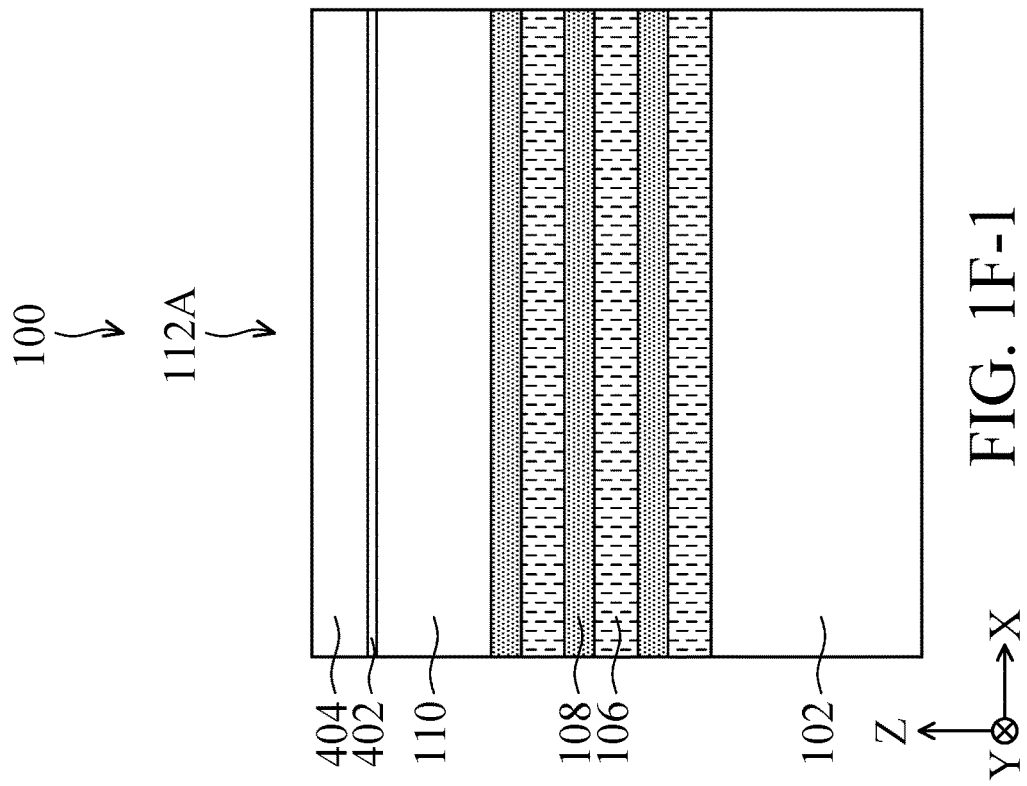

Referring to FIGS, 1F-1 and 1F-2, a dielectric liner 402 is conformally formed over the fins 112, the isolation structures 202, and the cladding layer 302. In some embodiments, the dielectric liner 402 is formed of a dielectric material to allow selective etching of the cladding layer 302 without substantially damaging the dielectric liner 402. The dielectric liner 402 may include a high-k dielectric material, such as $HfO_2$, HfSiOx (such as $HfSiO_4$), HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. In some implementations, the dielectric liner 402 may be deposited using CVD, physical vapor deposition (PVD), ALD, high-density plasma chemical vapor deposition (HDP-CVD), metalorganic chemical vapor deposition (MOCVD), RPCVD, plasma-enhanced chemical vapor deposition (PECVD), LPCVD, atomic layer chemical vapor deposition (ALCVD), atmospheric pressure chemical vapor deposition (APCVD), other suitable methods, or combinations thereof. As shown in FIGS. 1F-1 and 1F-2, the dielectric liner 402 is also over the top surfaces of the hard mask layer 110 and on sidewalls and top surfaces of the cladding layer 302.

Referring to FIGS. 1F-1 and 1F-2, a filler layer 404 is formed over the workpiece 100. Specifically, the filler layer 404 is formed to fill the trenches between the fins 112 and formed over the hard mask layer 110, the fins 112, the cladding layer 302, and the dielectric liner 402. In some embodiments, a composition of the filler layer 404 may be similar to a composition of the isolation structures 202. In some embodiments, the filler layer 404 includes a low-k dielectric material such as a dielectric material including Si, O, N, and C (for example, silicon oxide ($SiO_2$), silicon nitride, silicon oxynitride, silicon oxy carbide, silicon oxy carbon nitride). In some embodiments, the filler layer 404 includes tetraethylorthosilicate (TEOS) formed oxide, undoped silicate glass, or doped silicon oxide such as borophosphosilicate glass (BPSG), fluoride-doped silica glass (FSG), phosphosilicate glass (PSG), boron doped silicon glass (BSG), other low-k dielectric materials, or combinations thereof. In these embodiments, the filler layer 404 may be deposited using CVD, SACVD, FCVD, ALD, PVD, spin-on coating, and/or other suitable process.

Figures 1, 1G, 2:
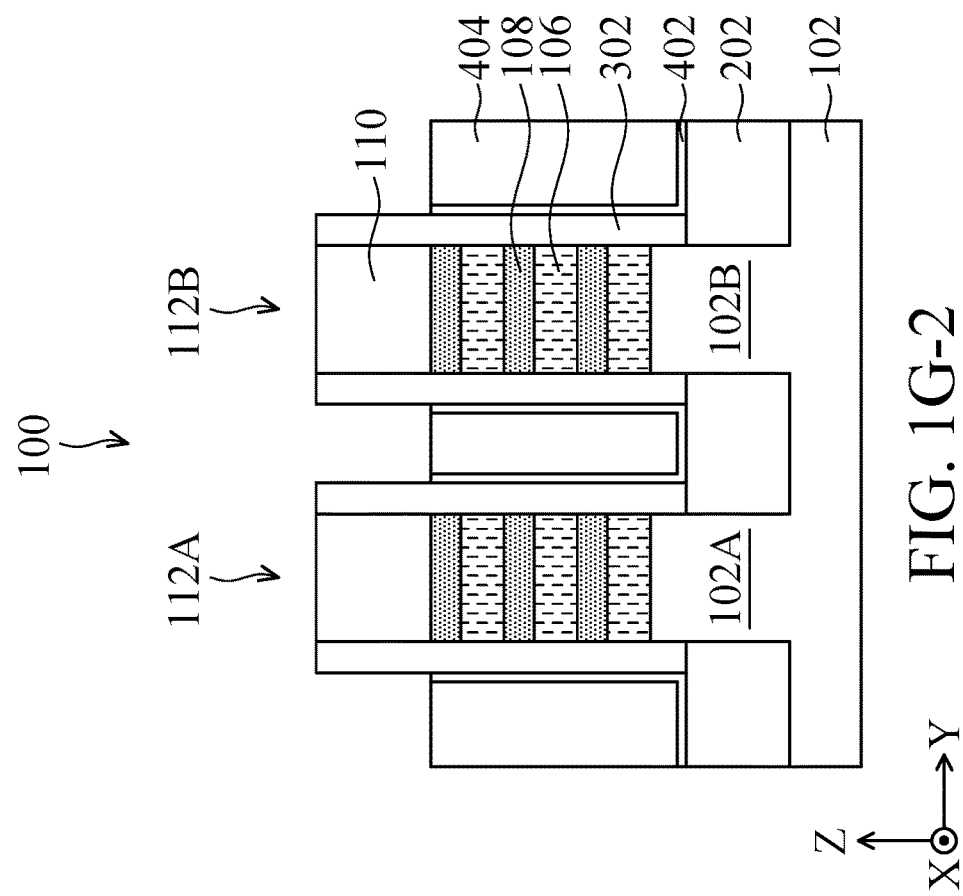
Figures 1, 1G:
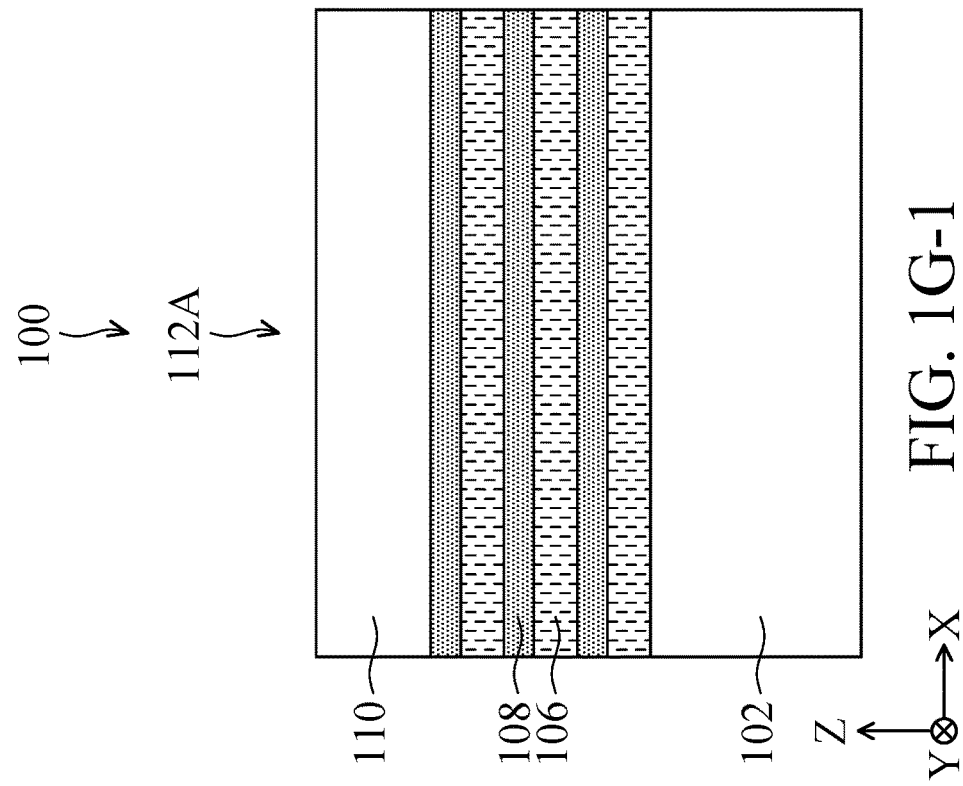

Referring to FIGS. 1G-1 and 1G-2, the filler layer 404 and the dielectric liner 402 are planarized (e.g., by a CMP process) and recessed (e.g., by an etching process, a wet etching process, and/or a combination thereof). The filler layer 404 and dielectric liner 402 are recessed to have top surfaces below the top surfaces of the hard mask layer 110. In some embodiments, the top surfaces of the filler layer 404 or dielectric liner 402 is below the topmost surfaces of the semiconductor layers 108. In some other embodiments, the top surfaces of the filler layer 4040 and dielectric liner 402 and the topmost surfaces of the semiconductor layers 108 are substantially coplanar. Similarly to isolation structures 202, the filler layer 404 is between or around neighboring fins 112. Specifically, the stack portions of the fins 112 are surrounded by the filler layer 404. In some aspects, the filler layer 404 also extends in the X-direction and arranged with the fins 112 in the Y-direction.

Figures 1, 1H, 2:
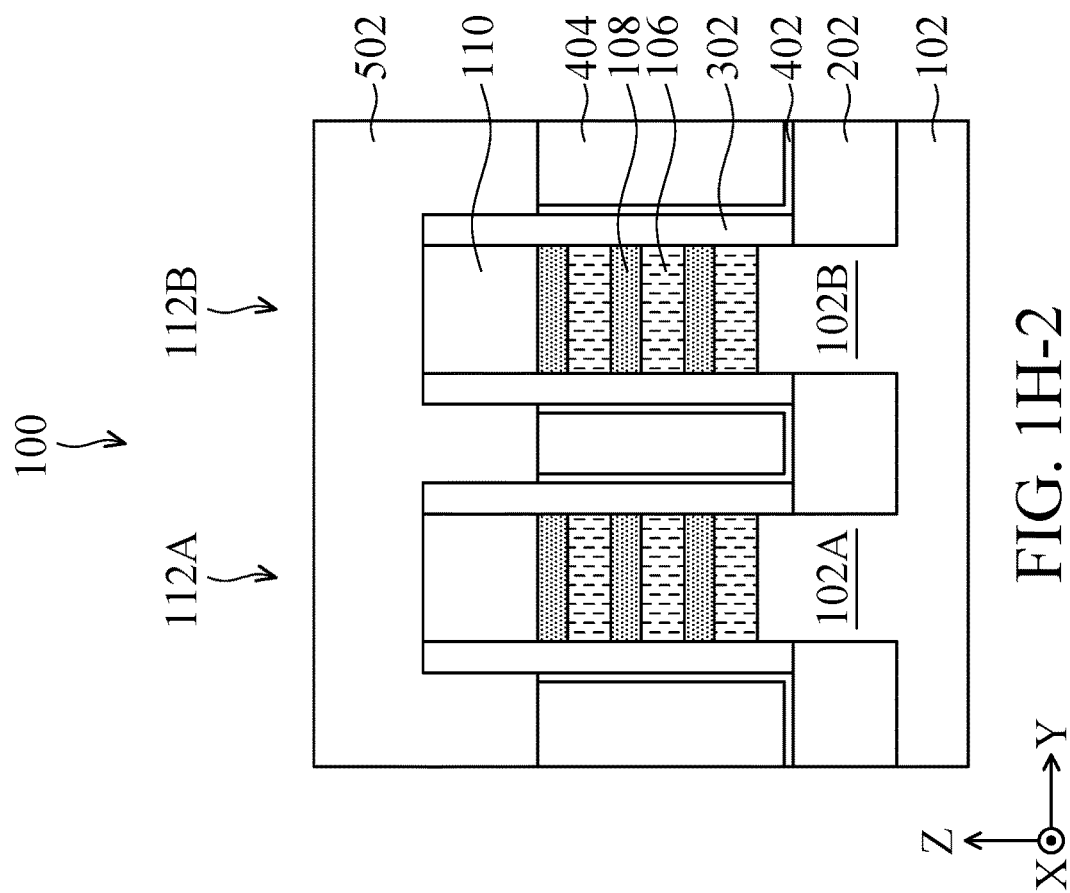
Figures 1, 1H:
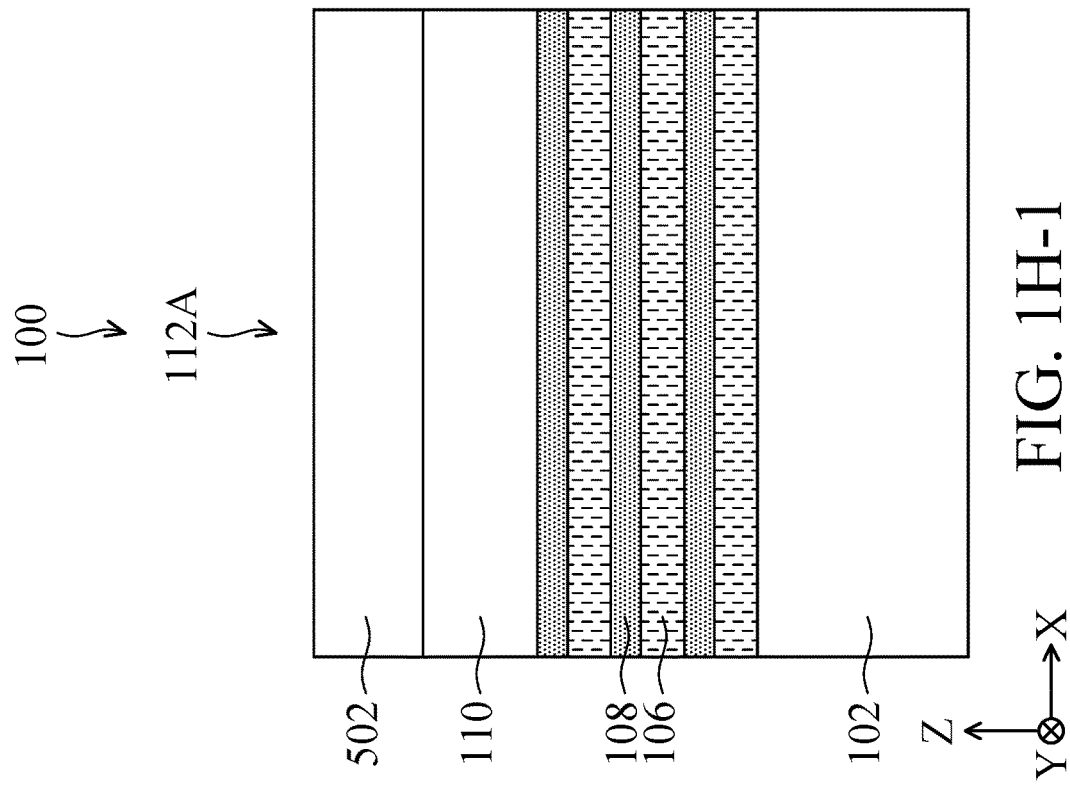

Referring to FIGS. 1H-1 and 1H-2, a dielectric material 502 is formed over the workpiece 100. Specifically, the dielectric material 502 is formed between and over the hard mask layer 110 and the cladding layer 302, and over the dielectric liner 402 and the filler layer 404. The dielectric material 502 may include high-K dielectrics, such as $HfO_2$, HfSiOx (such as $HfSiO_4$), HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. In some embodiments, the dielectric material may be deposited using ALD, CVD, PVD, oxidation-based deposition process, other suitable process, or combinations thereof.

Figures 1, 1I, 2:
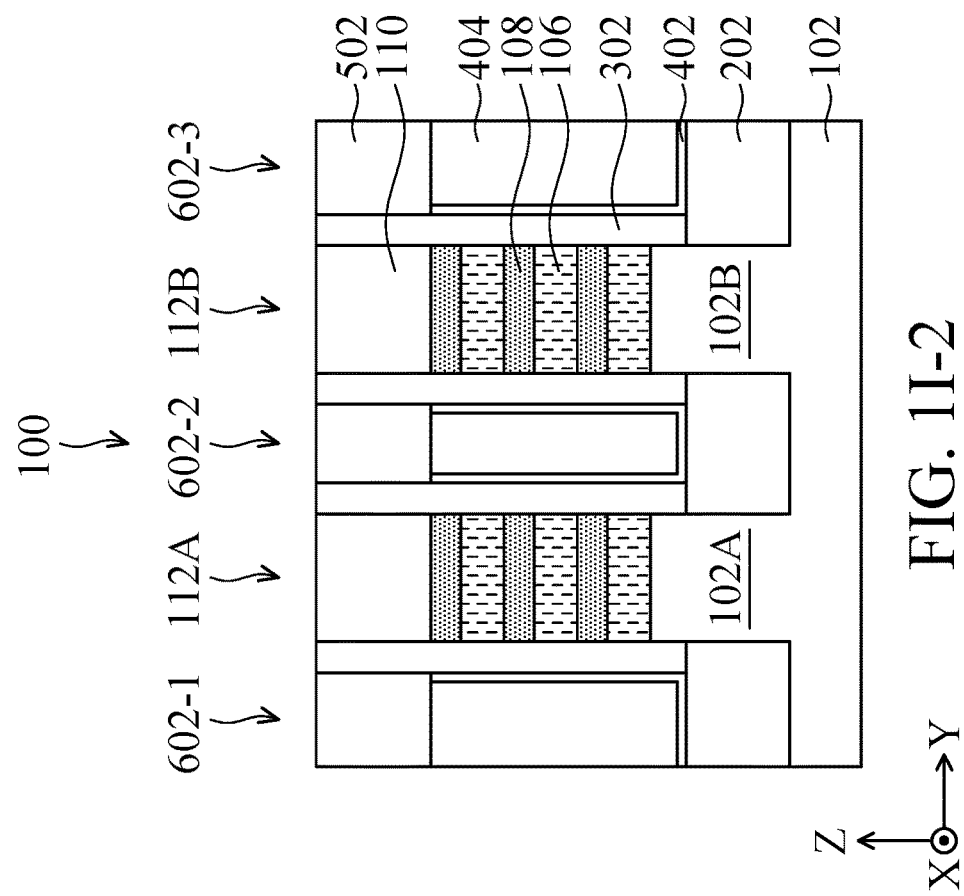
Figures 1, 1I:
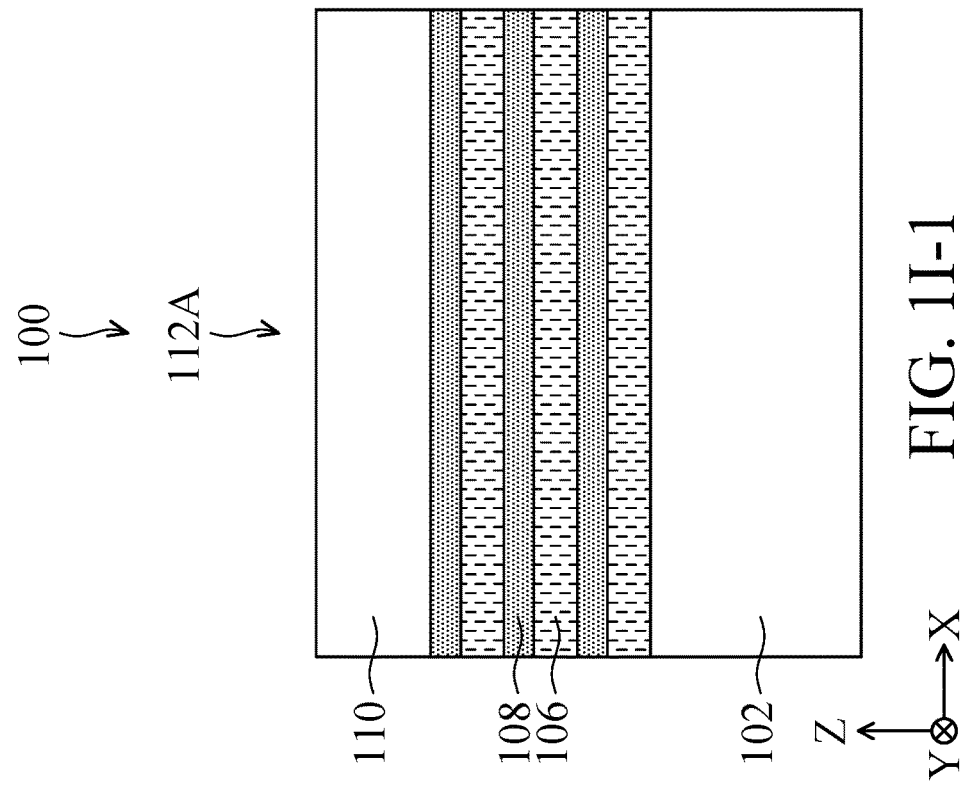

Referring to FIGS. 1I-1 and 1I-2, a CMP process is performed to remove excess dielectric material 502 over the hard mask layer 110. The top surfaces of the hard mask layer 110 and top surfaces of the cladding layer 302 are exposed after the CMP process. Further, in some embodiments, the top surfaces of the hard mask layer 110, the cladding layer 302, and the dielectric material 502 are substantially coplanar after the CMP process. Similarly, in some aspects, the dielectric material 502 extends in the X-direction and arranged with the fins 112 in the Y-direction (not shown).

As shown in FIGS. 1I-1 and 1I-2, After the CMP process, the remaining dielectric liner 402, the remaining filler layer 404, and the remaining dielectric material 502 between the fins 112 form the isolation features 602 (including isolation features 602-1, 602-2, and 603-3). The isolation features 602 are over the isolation structures 202. The isolation features 602 are in contact with sidewalls of the cladding layer 302. The isolation features 602 are in contact with the top surfaces of the isolation structures 202. The isolation features 602 separate the resultant GAA devices from other devices (not shown). In some embodiments, bottom surfaces of the isolation features 602 are lower than the bottommost semiconductor layers 108 (or bottommost surfaces of the semiconductor layers 108). In some embodiments, the bottom surfaces of the isolation features 602 are lower than topmost surfaces of the substrate 102 (i.e., top surfaces of the base portion 102A and 102B).

Referring to FIGS. 1J-1 and 1J-2, after the CMP process, the workpiece 100 is anisotropically etched to selectively remove a portion of the cladding layer 302 and the hard mask layer 110 to expose the topmost semiconductor layer 108 (or the topmost surface of the semiconductor layers 108), without substantially damaging the isolation material 502 of the isolation features 602. The anisotropic etch process may be a single stage etch process or a multi-stage etch process. In some implementations, the anisotropic etch process may include hydrogen, a fluorine-containing gas (e.g., $CF_4$, $SF_6$, $CH_2F_2$, $CHF_3$, and/or $C_2F_6$), a chlorine-containing; gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figures 1, 1K, 2:
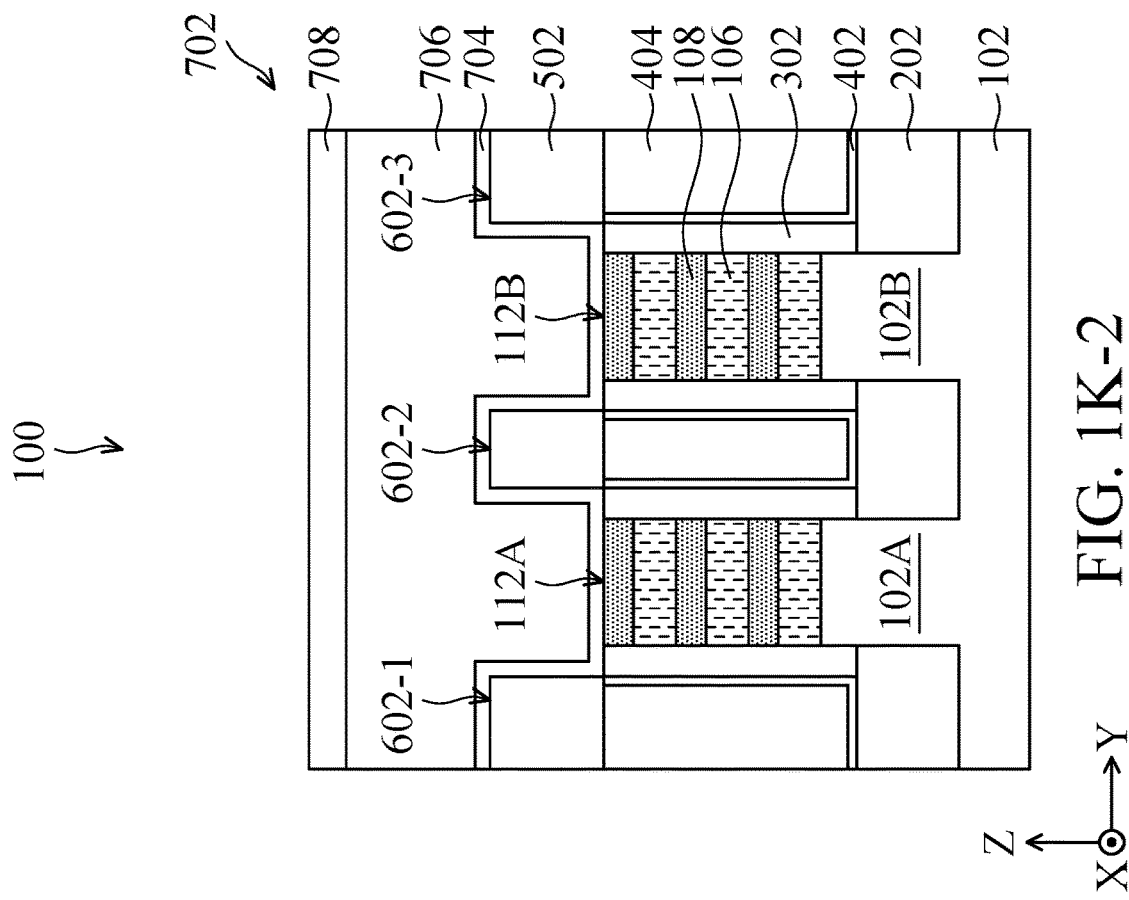
Figures 1, 1K:
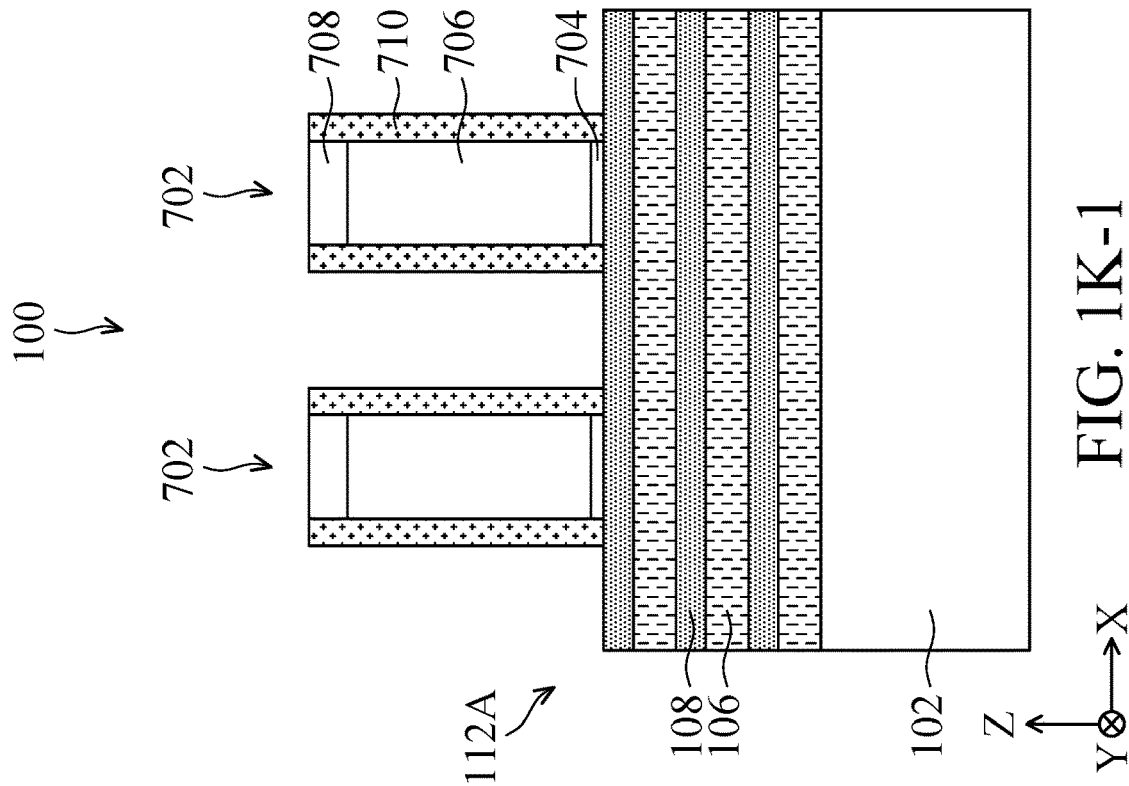

Referring to FIGS. 1K-1 and 1K-2, dummy gate structures 702 may be formed over the fins 112, the cladding layer 302, and the isolation material 502. The dummy gate structure 702 may be configured to extend along the Y-direction and wrap around the top surfaces and side surfaces of the isolation material 502, as shown in FIG. 1K-2. In some embodiments, to form the dummy gate structure 702, a dummy interfacial material for dummy interfacial layers 704 is first formed over the fins 112, the isolation features 602, and the cladding layer 302. In some embodiments, the dummy interfacial material may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 706 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD).

Then, hard mask layers 708 are formed over the dummy gate material. In some embodiments, the hard mask layers 708 may be formed using photolithography and removal (e.g., etching) processes. In some embodiments, the hard mask layers 708 may include photoresist materials or hard mask materials. In some embodiments, each of the hard mask layers 708 may include multiple layers, such as a silicon nitride layer and a silicon oxide layer. After the formation of the hard mask layers 708, a removal process (e.g., etching) may be performed to remove portions of the dummy gate material for the dummy gate electrodes 706 and the dummy interfacial material for the dummy interfacial layers 704 that do not directly underlie the hard mask layers 708, thereby forming the dummy gate structures 702 each having the dummy interfacial layer 704, the dummy gate electrode 706, and the hard mask layer 708. The dummy interfacial layer 704 may also be referred to as dummy gate dielectric. The dummy gate structures 702 may undergo a gate replacement process through subsequent processing to form metal gates, such as a high-k metal gate, as discussed in greater detail below.

Still referring to FIGS. 1K-1 and 1K-2, gate spacers 710 are formed on sidewalls of the dummy gate structures 702 and over top surface of the fins 112. The gate spacers 710 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 710 may include a single layer or a multi-layer structure. In some embodiments, the gate spacers 710 may be formed by depositing a spacer layer (containing the dielectric material) conformally over the fins 112 and the dummy gate structures 702, followed by an anisotropic etching process to remove top portions of the spacer layer from the top surfaces of the fins 112 and the dummy gate structures 702. After the etching process, portions of the spacer layer on the sidewalls of the dummy gate structures 702 and the fins 112 substantially remain and become the gate spacers 710. In some embodiments, the anisotropic etching process is a dry (e.g., plasma) etching process. Additionally or alternatively, the formation of the gate spacers 710 may also involve chemical oxidation, thermal oxidation, ALD, CVD, and/or other suitable methods. The gate spacers 710 may also be interchangeably referred to as the top spacers or gate top spacers.

Referring to FIGS. 1L-1 and 1L-2, the fins 112 are recessed to form source/drain trenches 802 in the fins 112 (or passing through the semiconductor layers 106 and 108). Specifically, the source/drain trenches 802 may be formed by performing one or more etching processes to remove portions of the semiconductor layers 106, the semiconductor layers 108, and the substrate 102 that do not vertically overlap or be covered by the dummy gate structures 702 and the gate spacers 710. In some embodiments, a single etchant may be used to remove the semiconductor layers 106, the semiconductor layers 108, and the substrate 102, whereas in other embodiments, multiple etchants may be used to perform the etching process. As shown in FIG. 1L-1, portions of the substrate 102 are etched, so that the source/drain trenches 802 each has a concave surface in the substrate 102.

Figures 1, 1M, 2:
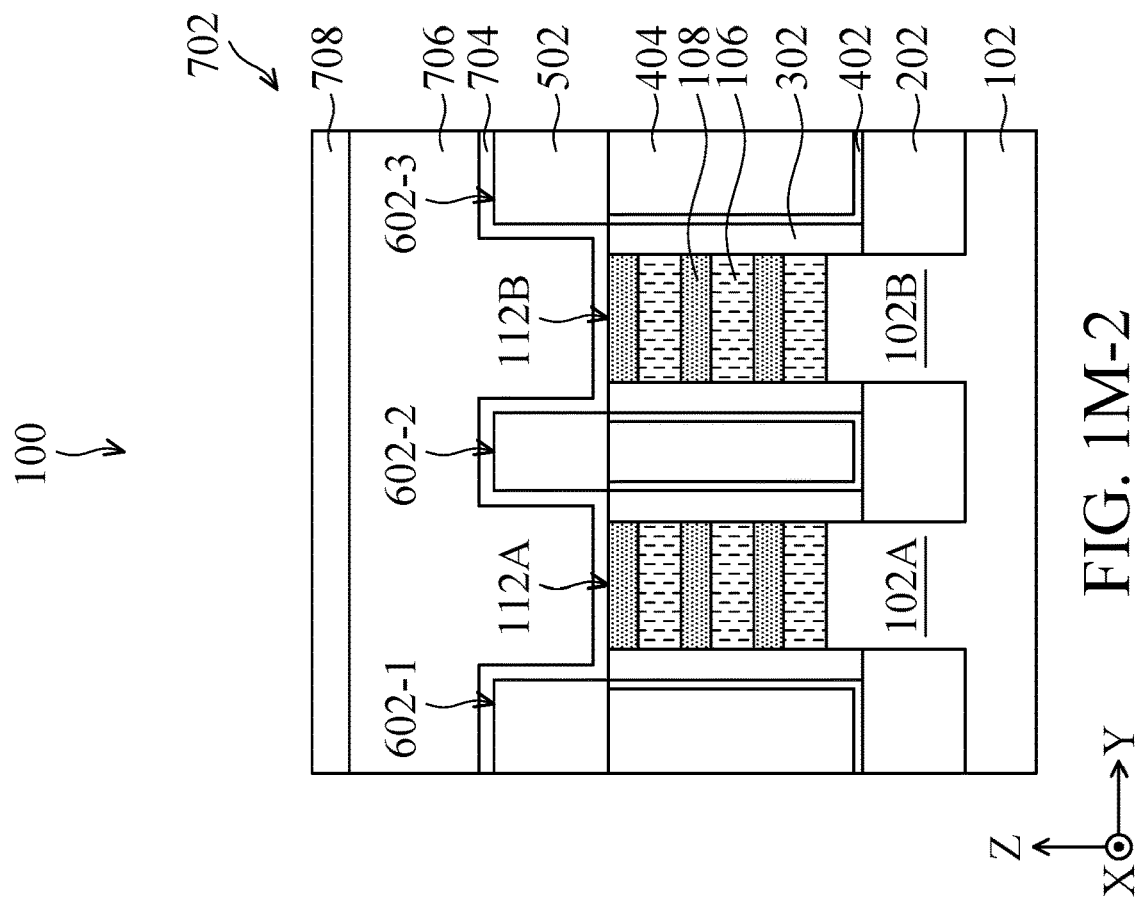
Figures 1, 1M:
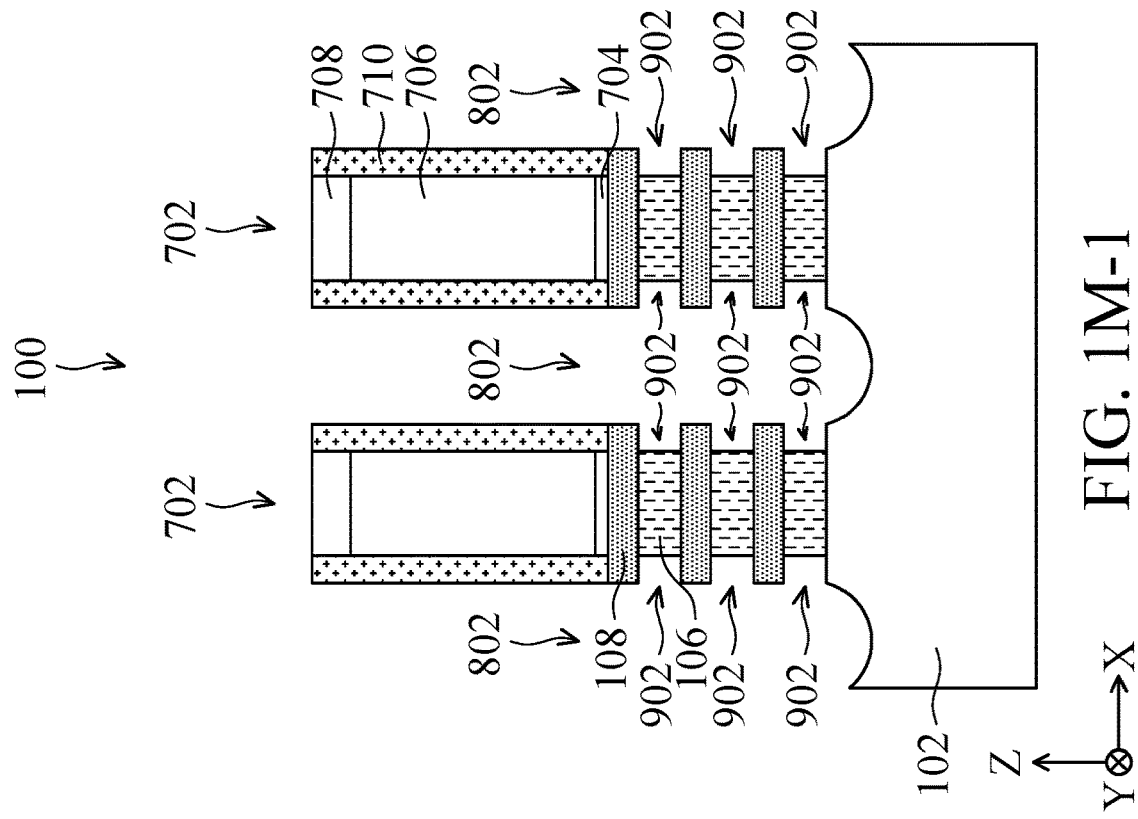

Referring to FIGS. 1M-1 and 1M-2, side portions of the semiconductor layers 106 are removed via a selective etching process. Specifically, the selective etching process is performed that selectively etches the side portions of the semiconductor layers 106 and the cladding layer 302 (not shown) below the gate spacers 710 through the source/drain trenches 802, with minimal (or no) etching of semiconductor layers 108, such that gaps 902 are formed between the semiconductor layers 108 as well as between the semiconductor layers 108 and the substrate 102, below the gate spacers 710. The etching process is configured to laterally etch (e.g., along the X-direction) the semiconductor layers 106 and the cladding layer 302 below the gate spacers 710. The selective etching process is a dry etching process, a wet etching process, other suitable etching process, or combinations thereof.

Figures 1, 1N, 2:
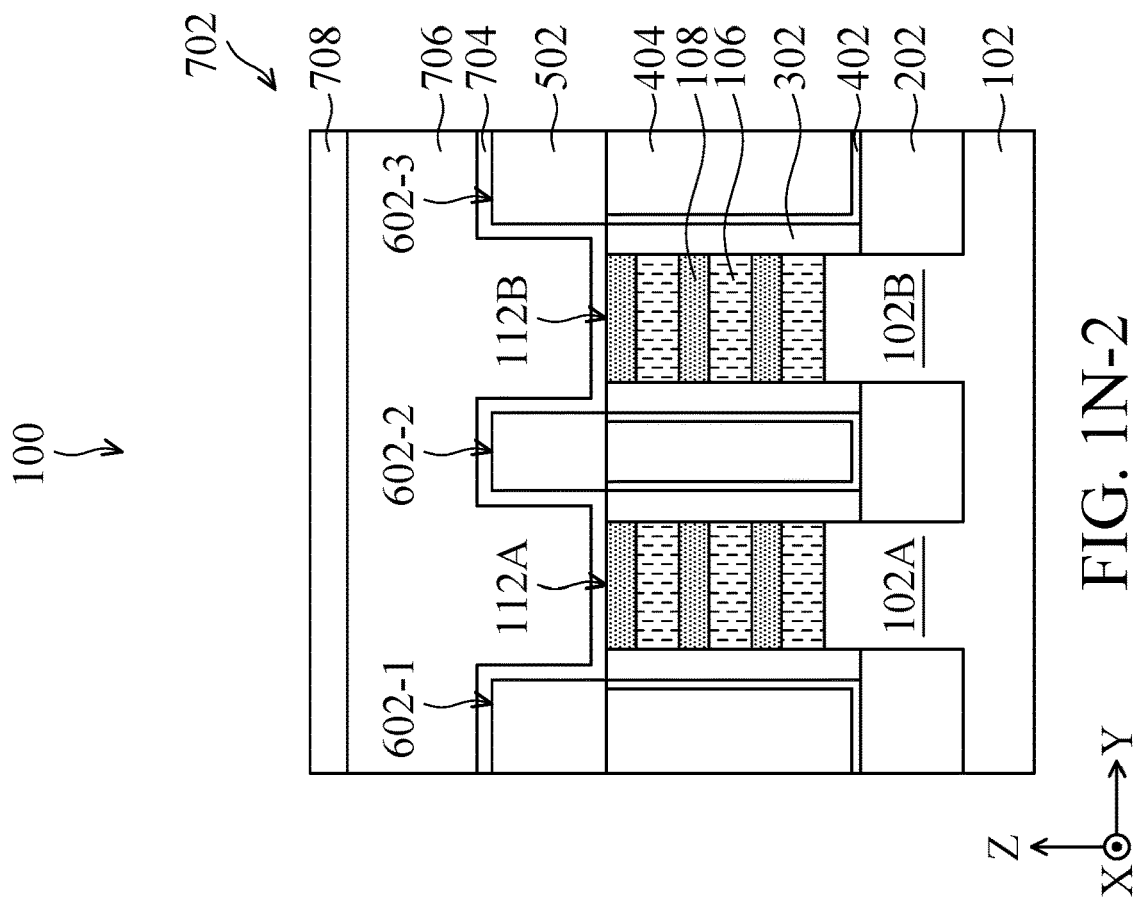
Figures 1, 1N:
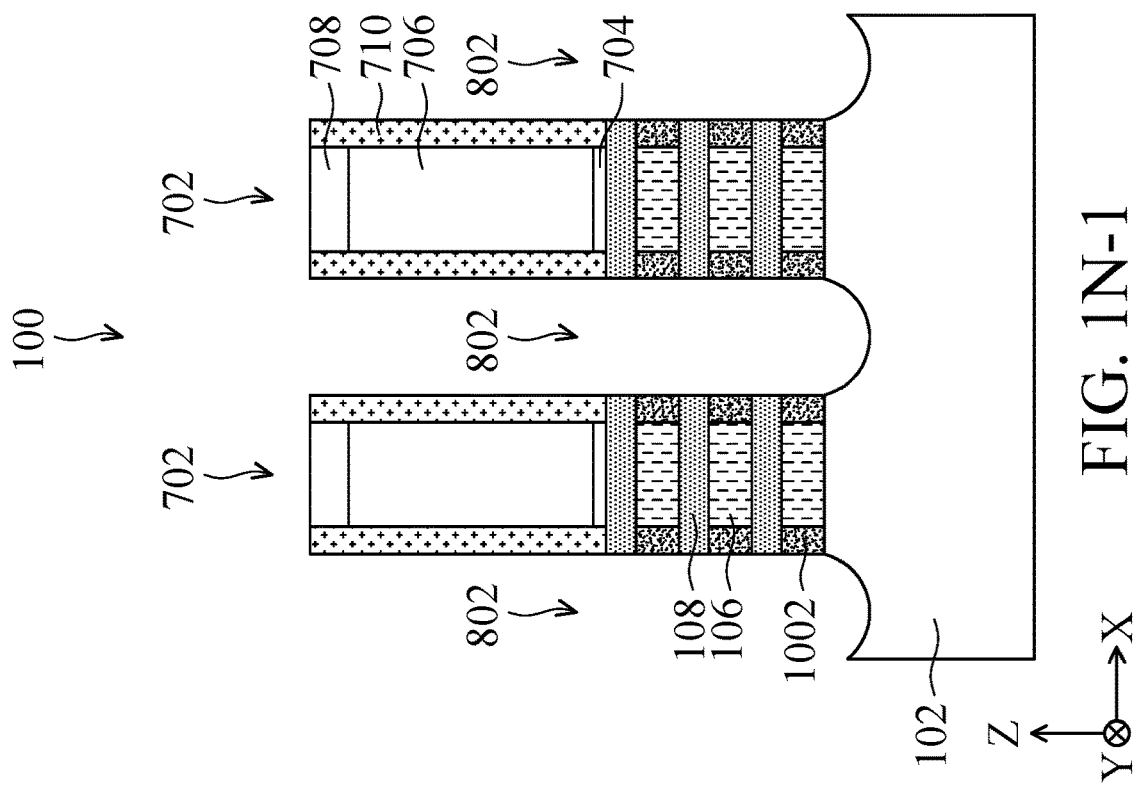
Figures 2, 10:
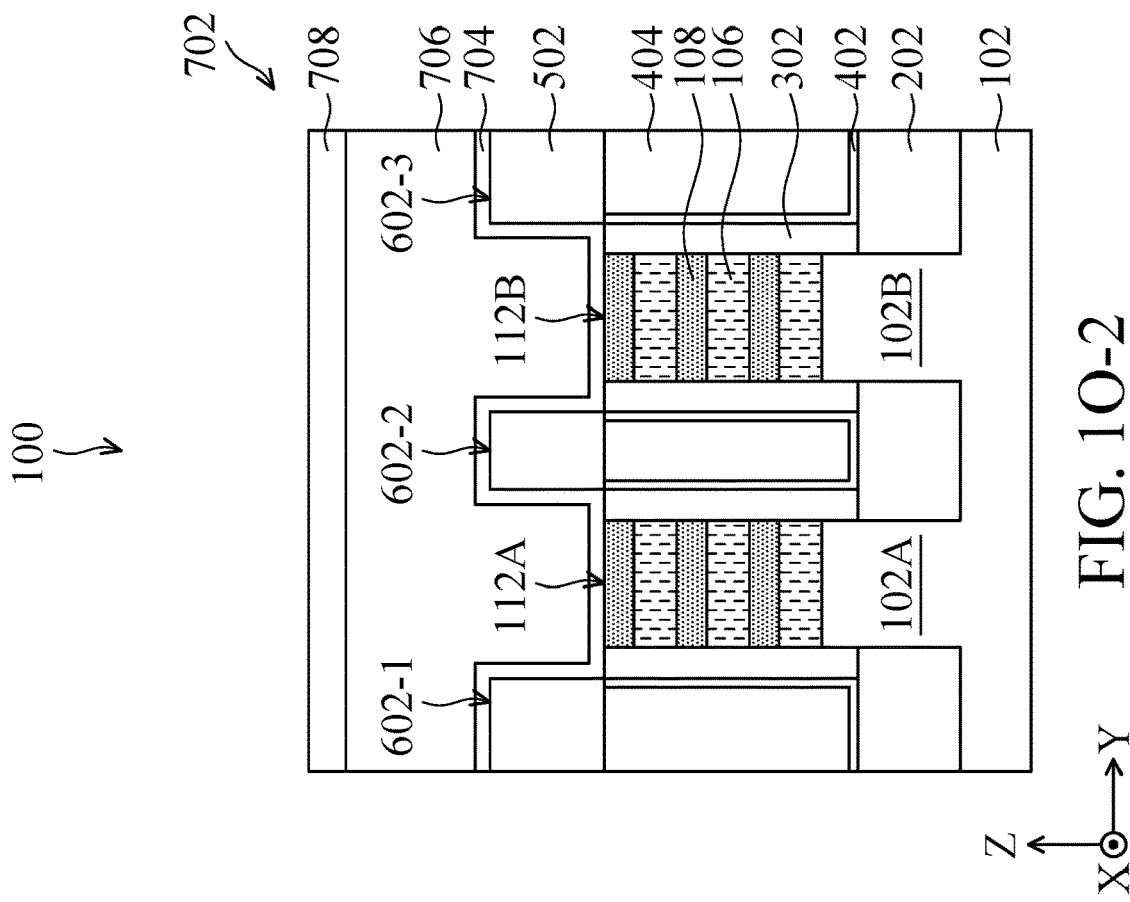
Figures 1, 10:
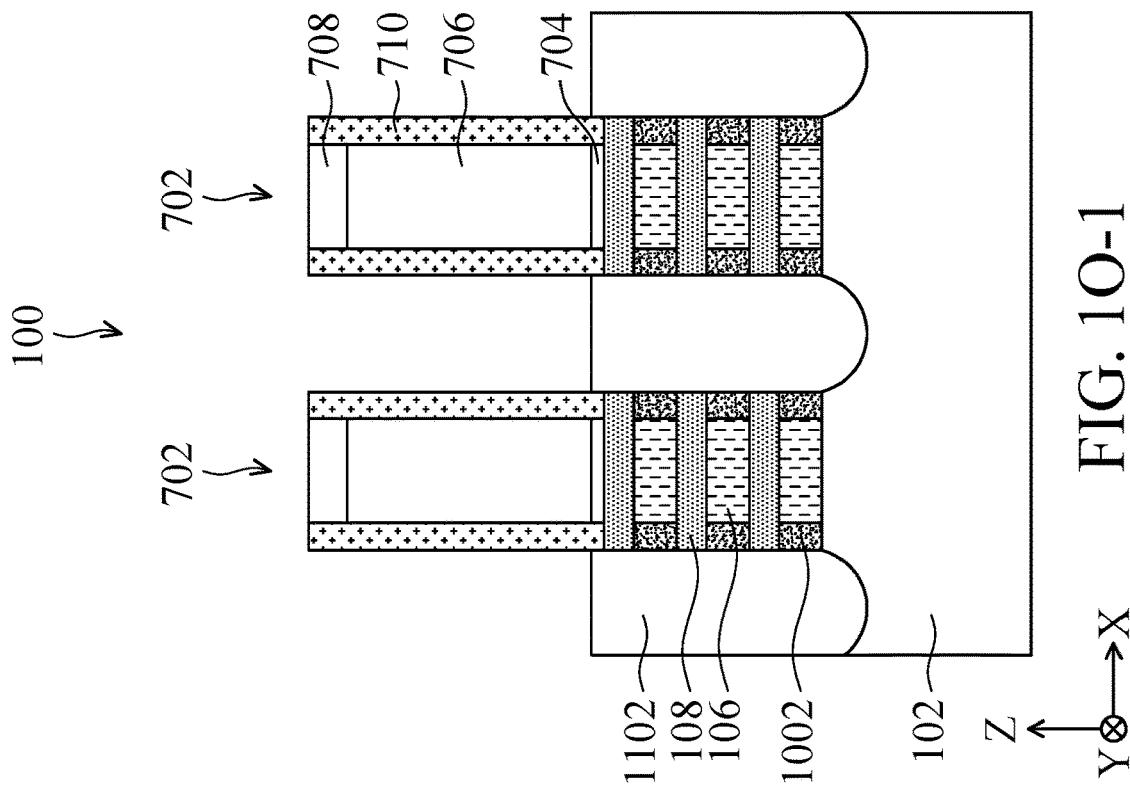

Referring to FIGS. 1N-1 and 1N-2, inner spacers 1002 are formed to fill the gaps 902. In some embodiments, sidewalls of the inner spacers 1002 are aligned to sidewalls of the gate spacers 710 and the semiconductor layers 108, as shown in FIG. 1N-1. In order to form the inner spacers 1002, a deposition process forms a spacer layer into the source/drain trenches 802 and the gaps 902, such as CVD PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 802. The deposition process is configured to ensure that the spacer layer fills the gaps 902 between the semiconductor layers 108 as well as between the semiconductor layer 108 and the substrate 102 under the gate spacers 710. An etching process is then performed that selectively etches the spacer layer to form inner spacers 1002 (as shown in FIG. 1N-1) with minimal (to no) etching of the semiconductor layer 108, the substrate 102, the dummy gate structures 702, and the gate spacers 710. The spacer layer and thus inner spacers 1002) includes a material that is different than a material of the semiconductor layers 108 and a material of the gate spacers 710 to achieve desired etching selectivity during the etching process. In some embodiments, the inner spacers 1002 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacers 1002 include a low-k dielectric material, such as those described herein.

Referring to FIGS. 1O-1 and 1O-2, source/drain features 1102 are formed in the source/drain trenches 802, so that the source/drain features 1102 pass through the semiconductor layers 108 and are in the fins 112. The source/drain features 1102 are in contact with the semiconductor layers 108. In some aspects, the semiconductor layers 108 connect one first source/drain feature 1102 to the other second source/drain feature 1102. One or more epitaxy processes may be employed to grow the source/drain features 1102. In some embodiments, the source/drain features 1102 may have surfaces that extend higher than the top surface of the topmost semiconductor layer 108 (e.g., in the Z-direction). Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1102 may include any suitable semiconductor materials. For example, the source/drain features 1102 in an n-type GAA device may include silicon (Si); silicon carbide (SiC), silicon phosphide (SiP), silicon arsenide (SiAs), silicon phosphoric carbide (SiPC), or combinations thereof; while the source/drain features 1102 in a p-type GAA device may include silicon (Si), silicon germanium (SiGe), germanium (Ge), silicon germanium carbide (SiGeC), or combinations thereof. The source/drain features 1102 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the source/drain features 1102. The annealing processes may include rapid thermal annealing (RTA) and/or laser annealing processes.

Figures 1, 1P, 2:
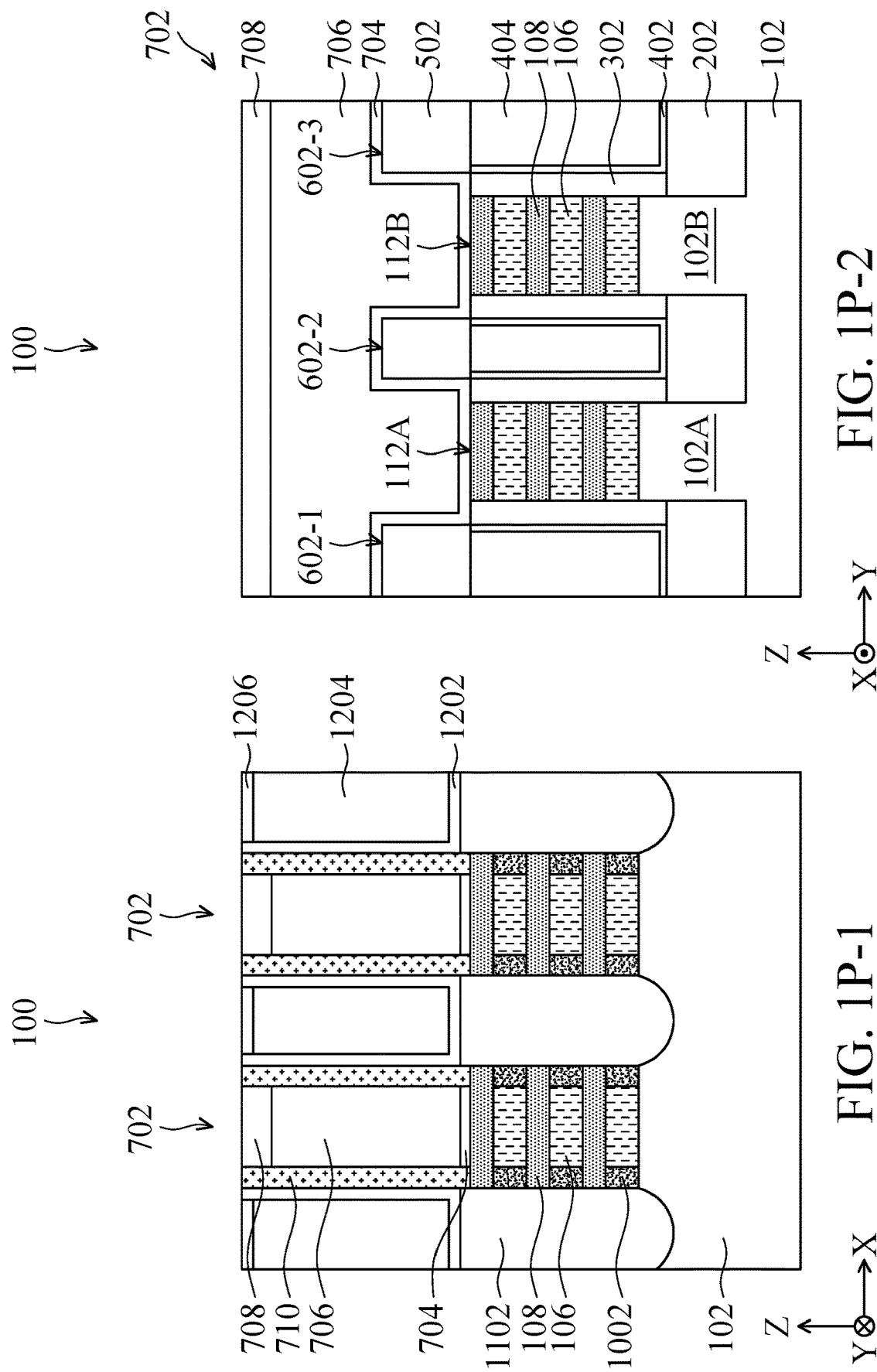

Referring to FIGS. 1P-1 and 1P-2, a contact etch stop layer (CESL) 1202 over the source/drain features 1102 and an interlayer dielectric (ILD) layer 1204 over the CESL 1202 are formed to fill the space between the gate spacers 710. Specifically, the CESL 1202 is conformally formed on the sidewalls of the gate spacers 710, over the top surfaces of the source/drain features 1102, as shown in FIG. 1P-1, The ILD layer 1204 is formed over and between the CESL 1202 to fill the space between the CESL 1202 or between the gate spacers 710. The CESL 1202 includes a material that is different than ILD layer 1204. The CESL 1202 may include $La_2O_3$, $Al_2O_3$, SiOCN, SiOC, SiCN, $SiO_2$, SiC, ZnO, ZrN, $Zr_2Al_3O_9$, $TiO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 1204 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 1204 may be formed by PECVD (plasma enhanced CVD), FCVD (flowable CVD), or other suitable methods.

Subsequent to the deposition of the CESL 1202 and the ILD layer 1204, a CMP process and/or other planarization process is performed on the CESL 1202 and the ILD layer 1204 until the top surfaces of the hard mask layers 708 of the dummy gate structures 702 are exposed. In some embodiments, the ILD layer 1204 is recessed to a level below the top surfaces of the dummy gate structures 702 and an ILD protection layer 1206 is formed over the ILD layer 1204 to protect the ILD layer 1204 from subsequent etching processes. As shown in FIG. 1P-1, the ILD layer 1204 is surrounded by the CESL 1202 and the ILD protection layer 1206. In some embodiments, the ILD protection layer 1206 includes a material that is the same as or similar to that in the CESL 1202. In some other embodiments, the ILD protection layer 1206 includes a dielectric material such as $Si_3N_4$, SiCN, SiOCN, SiOC, a metal oxide such as $HrO_2$, $ZrO_2$, hafnium aluminum oxide, and hafnium silicate, or other suitable material, and may be formed by CVD, PVD, ALD, or other suitable methods.

Figures 1, 1Q, 2:
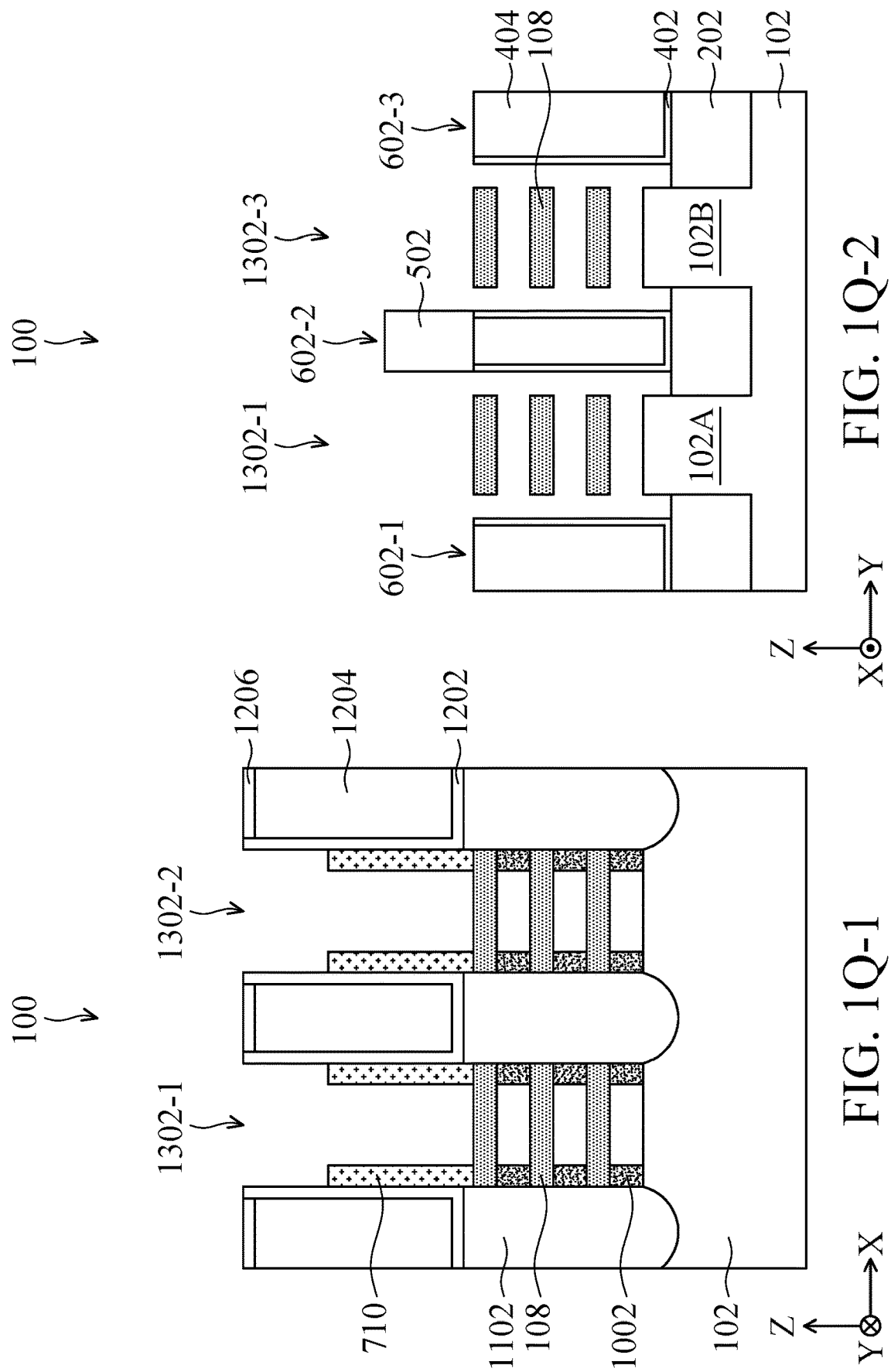

Referring to FIGS. 1Q-1 and 1Q-2, the dummy gate structures 702 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 702. Then, the dummy gate structures 702 are selectively etched through the masking element. The gate spacers 710 may be used as the masking element or a part thereof. In some embodiments, the gate spacers 710 are also partially recessed, as shown in FIG. 1Q-1. Etch selectivity may be achieved by selecting the appropriate etching chemicals, and the dummy gate structures 702 may be removed without substantially affecting the CESL 1202, the ILD layer 1204, and the ILD protection layer 1206. The removal of the dummy gate structures 702 creates gate trenches 1302-1, 1302-2, and 1302-3 (may be collectively referred to as gate trenches 1302). The gate trenches 1302 expose the top surfaces of the topmost semiconductor layers 108 and the cladding layer 302 that underlies the dummy gate structures 702. Further, in some embodiments, portions of the isolation material 502 of the isolation features 602 that directly underlies the dummy gate structures 702 may be removed, such as isolation material 502 of the isolation features 602-1 and 602-3 shown in FIG. 1Q-2, and the isolation material 502 of the isolation feature 602-2 shown in FIG. 1Q-2 remain.

Still referring to FIGS. 1Q-1 and the semiconductor layers 106 of the fins 112 and the cladding layer 302 are selectively removed through the gate trenches 1302, using a wet or dry etching process for example, so that the semiconductor layers 108 and are exposed in the gate trench 1302 to form nanostructures stacked over each other. Such a process may also be referred to as a wire release process, a nanowire release process, a nanosheet release process, a nanowire formation process, a nanosheet formation process, or a wire formation process. In some embodiments, the removal of the semiconductor layers 106 and the cladding layer 302 causes the exposed semiconductor layers 108 to be spaced apart from each other in the vertical direction (e.g., in the Z-direction). The exposed semiconductor layers 108 extend longitudinally in the horizontal direction (e.g., in the X-direction), and each connects one source/drain feature 1102 to another source/drain feature 1102.

Referring to FIGS. 1R-1 and 1R-2, the semiconductor layers 108 of the fins 112 in the gate trench 1302-2 are selectively removed through any suitable lithography and etching processes. The lithography process is similar to that for removing dummy gate structures 702. Etch selectivity may be achieved by selecting the appropriate etching chemicals, and the semiconductor layers 108 of the fins 112 in the gate trench 1302-2 may be removed without substantially affecting the CESL 1202, the ILD layer 1204, and the ILD protection layer 1206, the gate spacers 710, and the inner spacers 1002. Further, in some embodiments, a portion of the substrate 102 in the gate trench 1302-2 is removed. Specifically, the substrate 102 in the gate trench 1302-2 is further recessed, so that a bottom surface of the gate trench 1302-2 is lower than bottom surfaces of the source/drain features 1102, as shown in FIG. 1R-1. Some portions of the semiconductor layers 108 remain between the inner spacers 1002.

Referring to FIGS. 1S-1 and 1S-2, a dielectric material 1402 are formed to fill the gate trench 1302-2 to form a dielectric based gate for isolating resultant active devices from other devices. Specifically, the dielectric material 1402 is formed over the substrate 102, between the CESL 1202, between the gate spacers 710, between the remaining semiconductor layers 108, and between the inner spacers 1002. A top surface of the dielectric material 1402 and top surfaces of the ILD protection layer 1206 are substantially coplanar. The dielectric material 1402 may be different than the material of the ILD layer 1204. In some embodiments, the dielectric material 1402 includes a material that is the same as or similar to that in the CESL 1202 and the ILD protection layer 1206. In some other embodiments, the dielectric material 1402 includes a dielectric material such as $Si_3N_4$, SiCN, SiOCN, SiOC, a metal oxide such as $HrO_2$, $ZrO_2$, hafnium aluminum oxide, and hafnium silicate, or other suitable material, and may be formed by CVD, PVD, ALD, or other suitable methods.

Figures 1, 1T, 2:
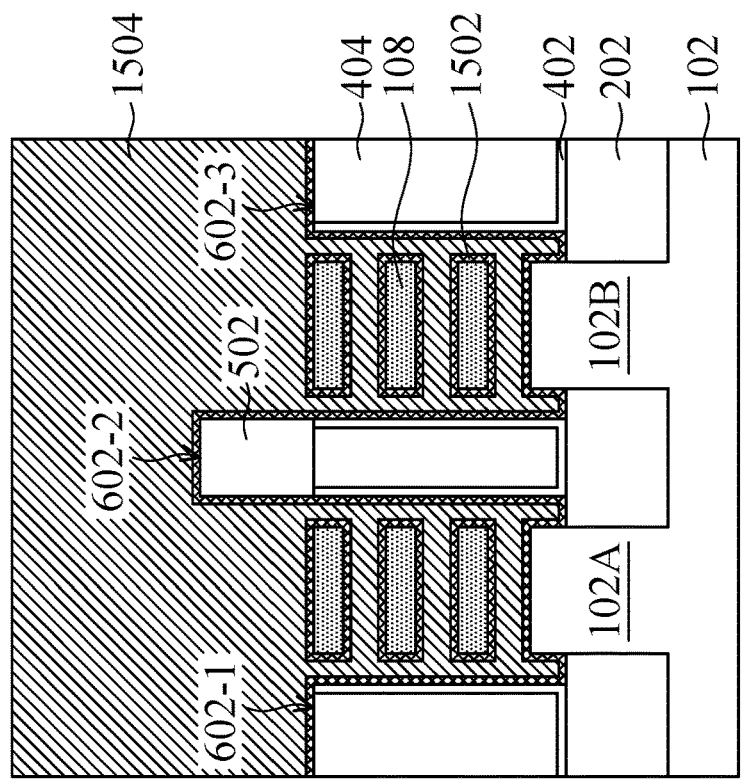
Figures 1, 1T:
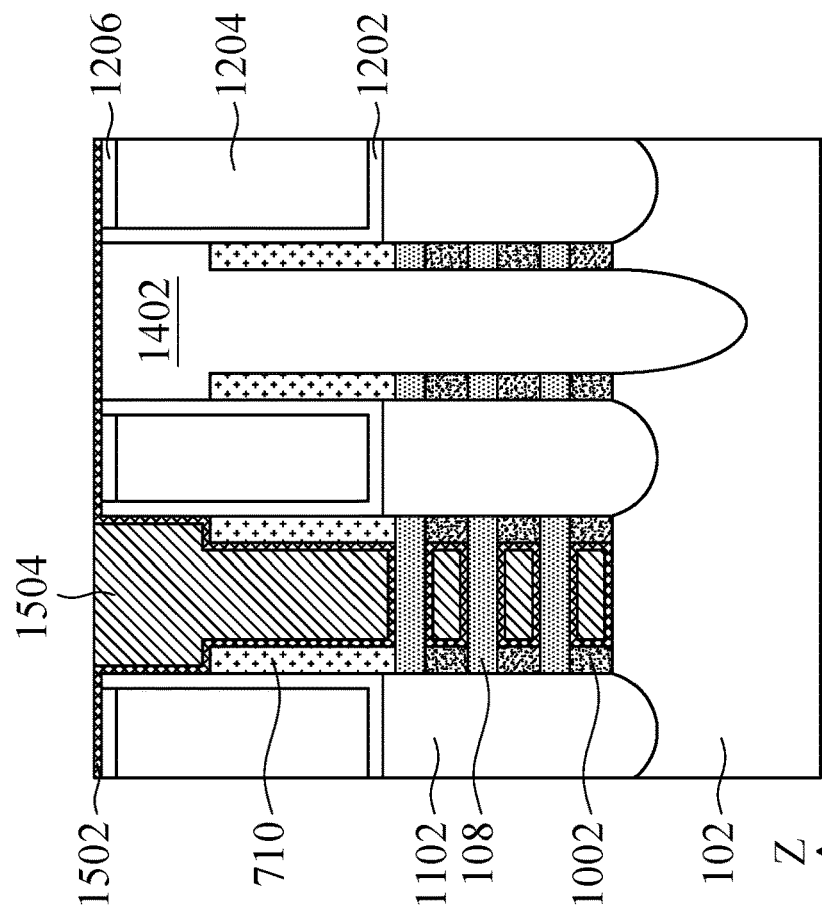

Referring to FIGS. 1T-1 and 1T-2, a gate dielectric layer 1502 and a gate electrode 1504 over the gate dielectric layer 1502 are formed in the gate trenches 1302-1 and 1302-3. In some embodiments, the gate dielectric layer 1502 is formed to wrap around the semiconductor layers 108. Additionally, the gate dielectric layer 1502 also formed on sidewalls of the inner spacers 1002, the gate spacers 710, the CESL 1202, and the isolation material 502 (of the isolation feature 602-2), as well as over the top surfaces of the filler layer 404, the isolation material 502 (of the isolation feature 602-2), the ILD protection layer 1206, and the isolation structures 202. The gate dielectric layer 1502 may include a dielectric material having a dielectric constant greater than a dielectric constant of $SiO_2$, which is approximately 3.9. For example, the gate dielectric layer 1502 may include hafnium oxide ($HfO_2$), which has a dielectric constant in a range from about 18 to about 40. Alternatively, the gate dielectric layer 1502 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 1502 may be formed by ALD, PVD, CVD, oxidation, and/or other suitable methods.

In some embodiments, interfacial layer may be formed to wrap around the exposed semiconductor layers 108 before the formation of the gate dielectric layer 1502, so that the gate dielectric layer 1502 is separated from semiconductor layers 108 by the interfacial layer. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

The gate electrode 1504 is formed to fill the remaining spaces of the gate trenches 1302-1 and 1302-3, and over the gate dielectric layer 1502 in such a way that the gate electrode 1504 wraps around the semiconductor layers 108, the gate dielectric layer 1502, and the interfacial layers (if present). The gate electrode 1504, the gate dielectric layer 1502, and the interfacial layers (if present) may be collectively called as gate structure wrapping around the semiconductor layers 108. The gate electrode 1504 may include a single layer or alternatively a multi-layer structure. In some embodiments, the gate electrode 1504 may include a capping layer, a barrier layer, an n-type work function metal layer, a p-type work function metal layer, and a fill material (not shown).

The capping layer may be formed adjacent to the gate dielectric layer 1502 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-type work function metal layer may be formed adjacent to the barrier layer. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer.

The p-type work function metal layer may be formed adjacent to the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

Referring to FIGS. 1U-I and 1U-2, the gate electrode 1504 is recessed to form an opening 1602, such that a top surface of the gate electrode 1504 is below the top surface of the isolation material 502 (of the isolation feature 602-2), but above the top surfaces of the filler layer 404. As shown in FIG. 1U-2, the gate electrode 1504 is effectively cut or separated. This process may also be referred to as self-aligned cut metal gate process (or self-aligned metal gate cut process) because it cuts metal gates without using a photolithography process in this stage and the location of the cuts is predetermined by the location of the isolation material 502. The self-aligned cut metal gate process is more advantageous than the photolithographic cut metal gate process in that the former is less affected by the photolithography overlay window or shift. This further enhances device down-scaling. As shown in FIG. 1U-2, the gate electrode 1504 is not cut at the locations of the filler layers 404 on which the isolation material 502 (as the isolation features 602-1 and 602-3 shown in FIG. 1P-2) are removed. In other words, as shown in FIG. 1U-2, the gate electrode 1504 to the left and to the right of the isolation material 502 remains connected as one continuous gate electrode layer and functions as one gate. The recessing of the gate electrode 1504 may implement a wet etching or a dry etching process that selectively etches the gate electrode 1504. In some embodiments, the etching process also etches the gate dielectric layer 1502 such that the gate dielectric layer 1502 over the top surfaces and top sidewalls of the isolation material 502 are removed. In some embodiments, portions of the gate dielectric layer 1502 on the sidewalls of the gate spacers 710, on the sidewalls of the CESL 1202, and over the ILD protection layer 1206 may also be removed and etched.

Figures 1, 1V, 2:
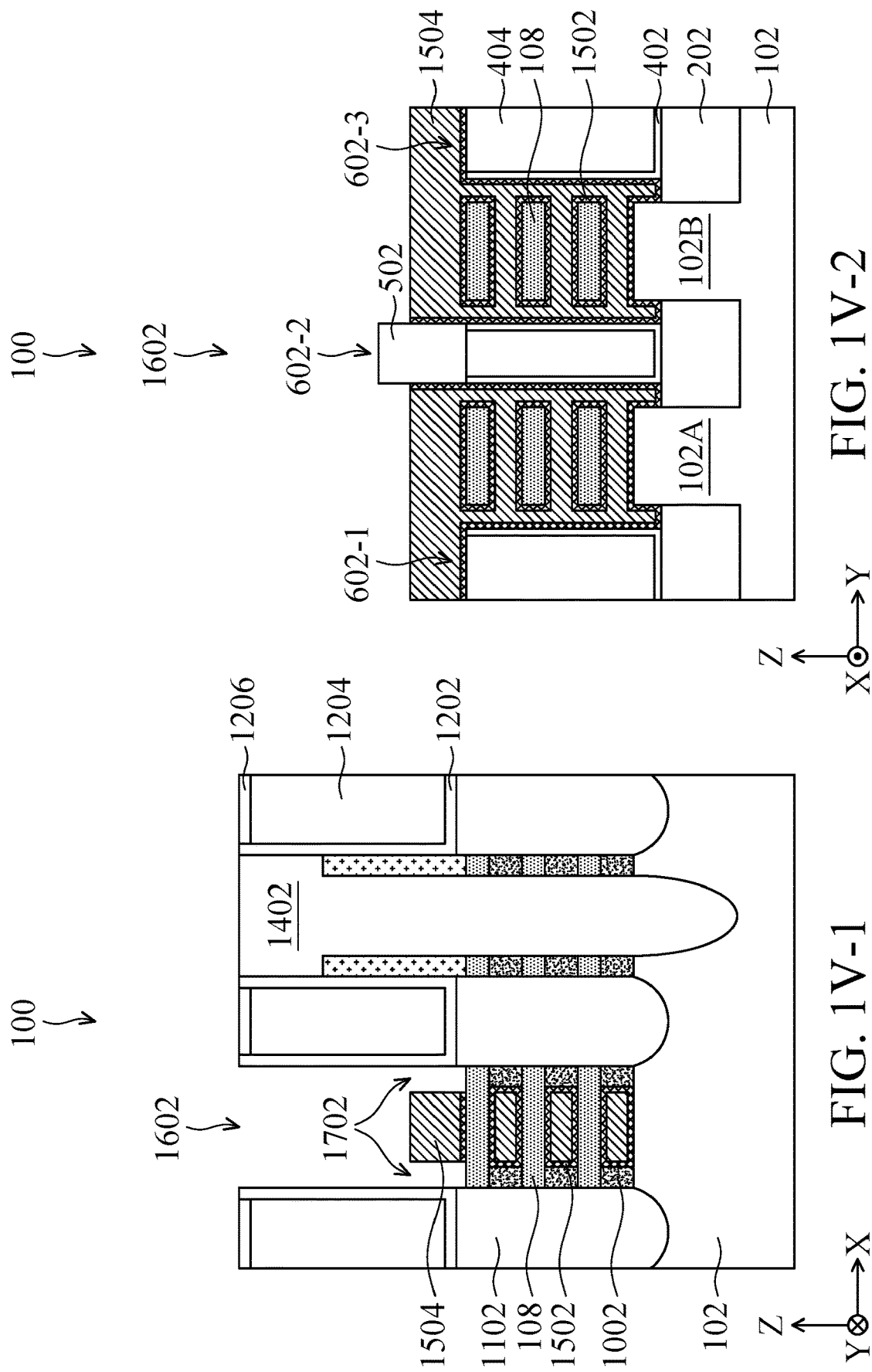

Referring to FIGS. 1V-1 and 1V-2, the gate spacers 710 in the opening 1602 is removed as well as the gate dielectric layer 1502 in the opening 1602 are partially removed through any suitable lithography and etching processes. The gate spacers 710 and the gate dielectric layer 1502 are respectively removed. Specifically, the gate spacers 710 in the opening 1602 is selectively removed at first through a first etching process with minimal (to no) etching of the semiconductor layers 108, the CESL 1202, the gate dielectric layer 1502, and the gate electrode 1504. The gate dielectric layer 1502 on sidewalls of the gate electrode 1504 and over the semiconductor layers 108 in the opening 1602 is then selectively removed through a second etching process with minimal (to no) etching of the semiconductor layers 108, the CESL 1202, and the gate electrode 1504. Two openings 1702 between the CESL 1202 and the gate electrode 1504 are formed in the opening 1602 after removing the gate spacers 710 and partially removing the gate dielectric layer 1502, as shown in FIG. 1V-1. The first etching process and the second etching process may be dry etching processes using plasma.

Figures 1, 1W, 2:
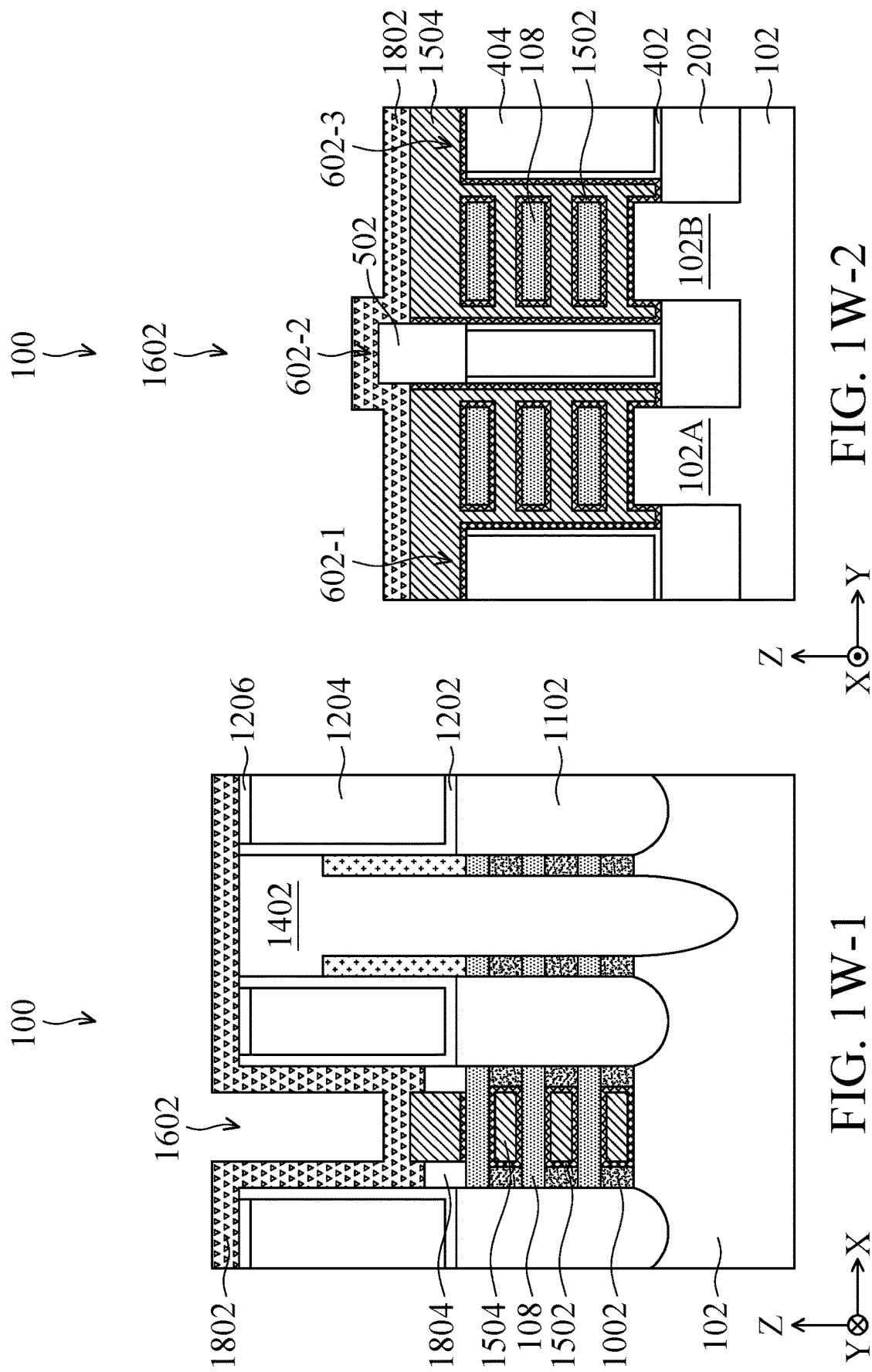

Referring to FIGS. 1W-1 and 1W-2, a seal layer 1802 is conformally formed on the sidewalls of the CESL 1202, over the gate electrode 1504, the CESL 1202, the ILD protection layer 1206, the dielectric material 1402, and the isolation material 502. In some embodiments, the seal layer 1802 includes a material that is the same as or similar to that in the ILD layer 1204. The seal layer 1802 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The seal layer 1802 may be formed by CVD, ALD, or other suitable deposition method. In some embodiments, a thickness of the seal layer 1802 is about 5 nm.

As shown in FIG. 1W-1, the seal layer 1802 seals the openings 1702 (shown in FIG. 1V-1) to form voids 1804. The seal layer 1802 is over the voids 1804. Each of the voids 1804 is between the gate structure (including the gate dielectric layer 1502 and the gate electrode 1504) and the CESL 1202, and between the seal layer 1802 and the semiconductor layers 108. In some aspects, the voids 1804 separate the gate structure from the CESL 1202. The voids 1804 are served as gate spacers, and then may also be referred to as air spacers. The voids 1804 include air having dielectric constant 1 (i.e., k=1). Such low dielectric constant may decrease parasitic capacitance of the resultant device. Further, as shown in FIG. 1W-1, the seal layer 1802 extends between the gate electrode 1504 and the CESL 1202, such that bottommost surfaces of the seal layer 1802 is lower than a top surface of the gate electrode 1504.

Figures 1, 1X, 2:
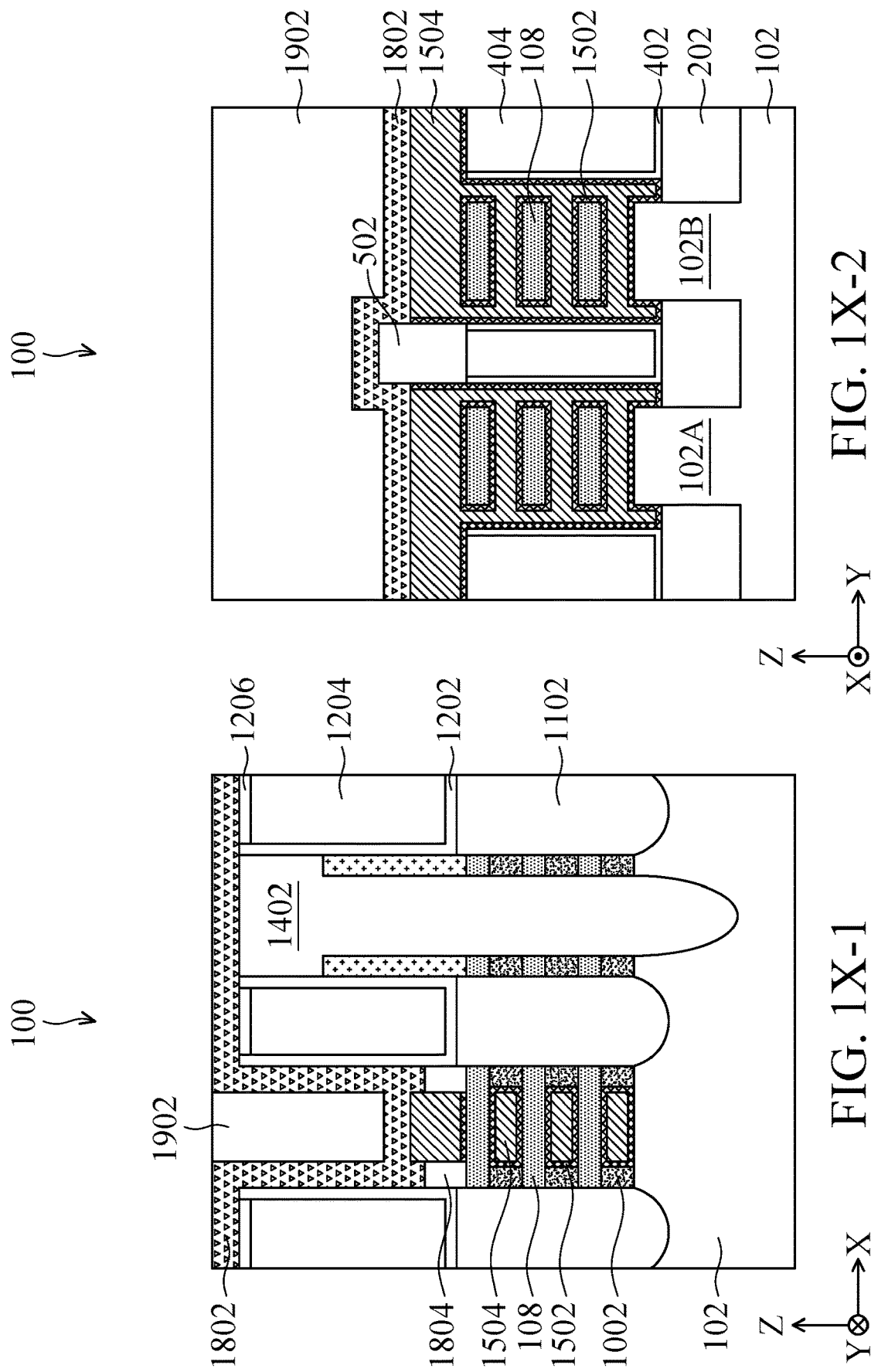

Referring to FIGS. 1X-1 and 1X-2, a hard mask layer 1902 is formed to fill the remaining spaces of the opening 1602. In some embodiments, the hard mask layer 1902 includes a material that is the same as or similar to that in the CESL 1202, the ILD protection layer 1206, and the dielectric material 1402. In some other embodiments, the hard mask layer 1902 includes a dielectric material such as $Si_3N_4$, SiCN, SiOCN, SiOC, a metal oxide such as $HrO_2$, $ZrO_2$, hafnium aluminum oxide, and hafnium silicate, or other suitable material, and may be formed by CVD, PVD, ALD, or other suitable methods.

After the formation of the hard mask layer 1902, the resultant structure of the workpiece 100 is formed. In some embodiments, the gate contacts and source/drain contacts (not shown) may be further formed to contact the gate electrode 1504 and source/drain features 1102. The gate contacts and source/drain contacts may each include a conductive material such as Al, Cu, W, Co, Ti, Ta, Ru, TiN, TiAl, TiAlN, TaN, TaC, NiSi, CoSi, combinations of these, or the like, although any suitable material may be deposited using a deposition process such as sputtering, CVD, electroplating, electroless plating, or the like.

FIG. 2 is a partial enlarged cross-sectional view of some alternative embodiments of the workpiece 100 of FIG. 1X-1. As shown in FIG. 1V-1, two openings 1702 between the CESL 1202 and the gate electrode 1504 are formed in the opening 1602 after removing the gate spacers 710 and partially removing the gate dielectric layer 1502. In some embodiments, portions of the gate dielectric layer 1502 between the gate electrode 1504 and a topmost surface of the semiconductor layers 108 are removed. Therefore, as shown in FIG. 2, a width W1 of the gate dielectric layer 1502 is smaller than a width W2 of the gate electrode 1504. Further, the voids 1804 are also enlarged. As shown in FIG. 2, portions of the voids 1804 extend between the gate electrode and a topmost surface of the semiconductor layers 108.

FIG. 3 is a partial enlarged cross-sectional view of some alternative embodiments of the workpiece 100 of FIG. 1X-1. In some embodiments, portions of the gate dielectric layer 1502 remain on the side ails of the gate electrode 1504 over the topmost surface of the semiconductor layers 108 after the removal of the gate spacers 710 and the partial removal of the gate dielectric layer 1502 in FIG. 1V-1. As shown in FIG. 3, the gate dielectric layer 1502 partially covers sidewalls of the gate electrode 1504 over the semiconductor layers 108 (or over the topmost surface of the semiconductor layers 108). In some aspects, the sidewalls of the gate electrode 1504 are partially covered by the gate dielectric layer 1502 and partially exposed by the voids 1804. In some embodiments, a height of the gate dielectric layer 1502 on the sidewall of the gate electrode 1504 over the semiconductor layers 108 is in a range from about 3 nm to about 5 nm.

FIG. 4 is a partial enlarged cross-sectional view of some alternative embodiments of the workpiece 100 of FIG. 1X-1. The workpiece 100 of FIG. 4 is similar to the workpiece 100 of FIG. 3, expect that the seal layer 1802 is in contact with the gate dielectric layer 1502. The portions of the gate dielectric layer 1502 remain on sidewalls of the gate electrode 1504 over the topmost surface of the semiconductor layers 108 in the process of FIG. 1V-1, and then the seal layer 1802 extends between the gate electrode 1504 and the CESL 1202 to contact the gate electrode 1504 in the process of FIG. 1W-1. In some aspects, a bottommost surface of the seal layer 1802 is in contact with the gate dielectric layer 1504. In some embodiments, the gate dielectric layer 1504 separates the gate electrode 1504 from the voids 1804 (i.e., the sidewalls of the gate electrode 1504 are not exposed by the voids 1804).

FIG. 5 is a partial enlarged cross-sectional view of some alternative embodiments of the workpiece 100 of FIG. 1X-1. The workpiece 100 of FIG. 5 is similar to the workpiece 100 of FIG. 4, expect that the gate electrode 1504 has a trapezoidal top portion. As discussed above, during the removal of the gate spacers 710 and the partial removal of the gate dielectric layer 1502 in FIG. 1V-1, the gate electrode 1504 over the semiconductor layers 108 may also be partially removed or etched, so that the gate electrode 1504 has two sloped surfaces to form the trapezoidal top portion, as shown in FIG. 5. In some embodiments, an angle θ of the sloped surface relative to a horizontal plane is in a range from about 60 degrees to about 90 degrees.

Figure 6:
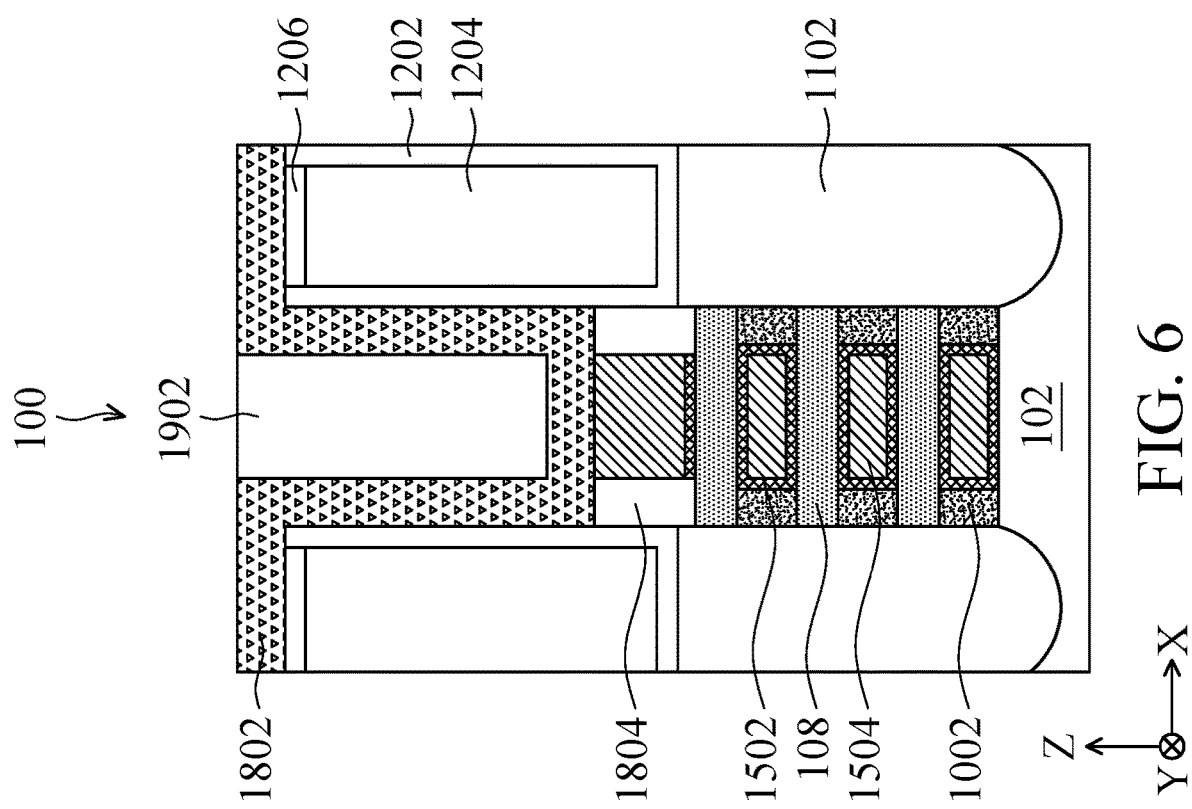

FIG. 6 is a partial enlarged cross-sectional view of some alternative embodiments of the workpiece 100 of FIG. 1X-1. The workpiece 100 of FIG. 6 is similar to the workpiece 100 of FIG. 1X-1. In some embodiments, during the formation of the seal layer 1802 in FIG. 1W-1, the seal layer 1802 may not extend between the gate electrode 1504 and the CESL 1202. Therefore, as shown in FIG. 6, the bottommost surface of the seal layer 1802 is aligned with the top surface of the gate electrode 1504.

Figure 7:
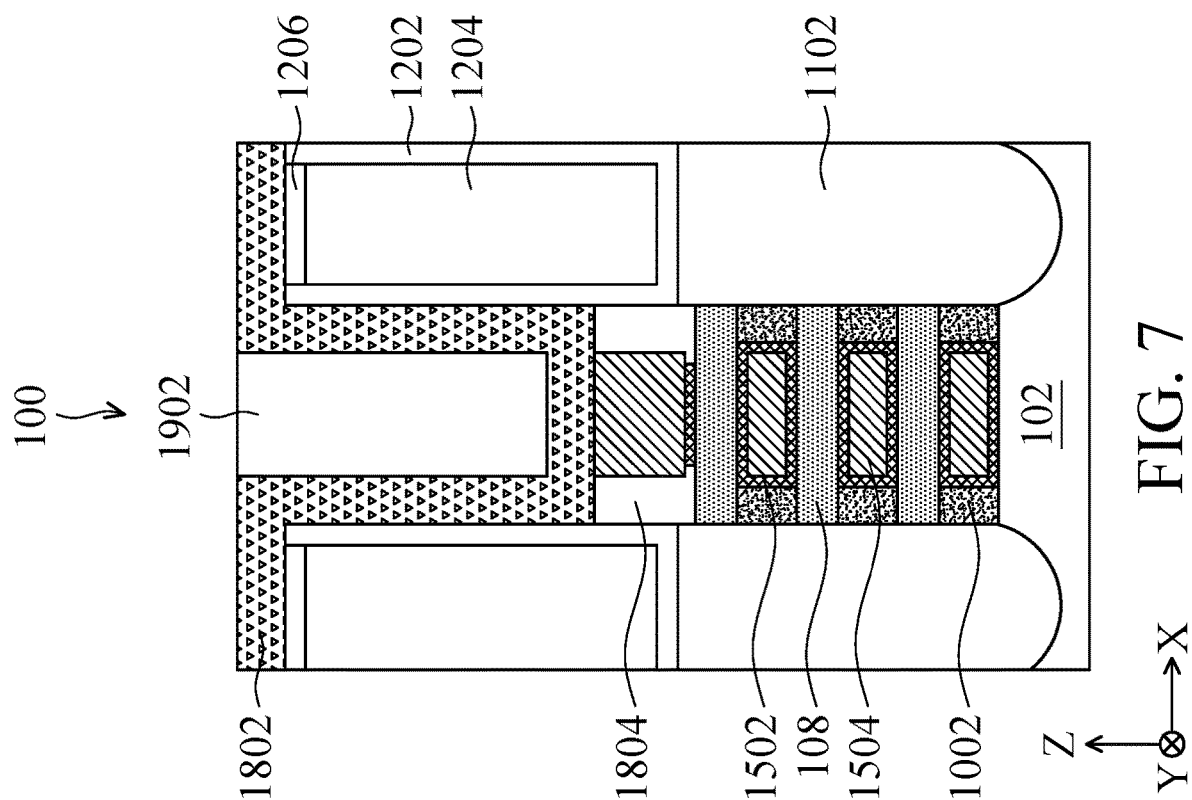

FIG. 7 is a partial enlarged cross-sectional view of some alternative embodiments of the workpiece 100 of FIG. 1X-1. The workpiece 100 of FIG. 7 is similar to the workpiece 100 of FIG. 2, expect that the bottommost surface of the seal layer 1802 is aligned with the top surface of the gate electrode 1504, since the seal layer 1802 may not extend between the gate electrode 1504 and the CESL 1202 in the process of FIG. 1W-1. FIG. 8 is a partial enlarged cross-sectional view of some alternative embodiments of the workpiece 100 of FIG. 1X-1. The workpiece 100 of FIG. 8 is similar to the workpiece 100 of FIG. 3, expect that the bottommost surface of the seal layer 1802 is aligned with the top surface of the gate electrode 1504, since the seal layer 1802 may not extend between the gate electrode 1504 and the CESL 1202 in the process of FIG. 1W-1.

FIG. 9 is a partial enlarged cross-sectional view of some alternative embodiments of the workpiece 100 of FIG. 1X-1. During the formation of the seal layer 1802 in FIG. 1W-1, the seal layer 1802 is formed into the openings 1702 without fully filling the openings 1702. Therefore, as shown in FIG. 9, the voids are embedded in the seal layer 1802, and between gate electrode 1504 and the CESL 1202. In some embodiments, the seal layer 1802 is in contact with the topmost surface of the semiconductor layers 108. In some embodiments, the seal layer is in contact with the source/drain features 1102.

The embodiments disclosed herein relate to semiconductor structures and their manufacturing methods, and more particularly to semiconductor structures comprising a gate-all-around (GAA) structure or device having voids between the gate structure and the contact etch stop layer for serving as gate spacers. Furthermore, the present embodiments provide one or more of the following advantages. The voids including air having low dielectric constant 1 (i.e., k=1), such that the parasitic capacitance of the GAA structure or device may be decreased, thereby preventing the GAA structure or device from performance degradation as the GAA structure or device continue to be scaled down.

Thus, one of the embodiments of the present disclosure describes a semiconductor structure including a substrate, nanostructures over the substrate, and a gate structure wrapping around the nanostructures. The gate structure includes a gate dielectric layer and a gate electrode wrapping around the gate dielectric layer. In some embodiments, the semiconductor structure further includes a source/drain feature in contact with the nanostructures, a contact etch stop layer over the source/drain feature, and a seal layer over the air spacer and the gate structure, and on a sidewall of the contact etch stop layer. The contact etch stop layer is separated from the gate structure by an air spacer.

In some embodiments, the seal layer extends between the gate electrode and the contact etch stop layer.

In some embodiments, the gate dielectric layer partially covers a sidewall of the gate electrode over the nanostructures.

In some embodiments, a height of the gate dielectric layer on the portion of the sidewall of the gate electrode is in a range from 3 nanometers to 5 nanometers.

In some embodiments, the seal layer is in contact with the gate dielectric layer.

In some embodiments, a bottommost surface of the seal layer is aligned with a top surface of the gate electrode.

In some embodiments, the seal layer is in contact with a topmost surface of the nanostructures.

In some embodiments, the air spacer extends between the gate electrode and a topmost surface of the nanostructures.

In some embodiments, the gate electrode has a trapezoidal top portion.

In another of the embodiments, discussed is a semiconductor structure including a substrate, a first source/drain feature and a second source/drain feature over the substrate, and semiconductor layers vertically stacked over each other. The semiconductor lavers connect the first source/drain feature to the second source/drain feature. In some embodiments, the semiconductor structure further includes a gate structure wrapping around the semiconductor layers. The gate structure includes a gate dielectric layer and a gate electrode wrapping around the gate dielectric layer. In some embodiments, the semiconductor structure further includes a contact etch stop layer over the first source/drain feature and the second source/drain feature and a seal layer over the gate structure and on sidewalk of the contact etch stop layer. Voids are formed between the seal layer and the semiconductor layers.

In some embodiments, a bottommost surface of the seal layer is aligned with a top surface of the gate electrode.

In some embodiments, a width of the gate dielectric layer over the semiconductor layers is smaller than a width of the gate electrode.

In some embodiments, a sidewall of the gate electrode is partially covered by the gate dielectric layer and partially exposed by the voids.

In some embodiments, a bottommost surface of the seal layer is lower than a top surface of the gate electrode.

In some embodiments, the bottommost surface of the seal layer is in contact with the gate dielectric layer.

In some embodiments, the voids are embedded in the seal layer.

In yet another of the embodiments, discussed is a method for manufacturing a semiconductor structure that includes forming a fin over a substrate. The fin includes first semiconductor layers and second semiconductor layers alternating stacked. In some embodiments, the method further includes forming a dummy gate structure over the fin, forming gate spacers on sidewalls of the dummy gate structure, forming source/drain features in the fin, forming a contact etch stop layer over the source/drain features, removing the dummy gate structure and the first semiconductor layers in the fin to form a gate trench, and forming a gate structure in the gate trench. The gate structure includes a gate dielectric layer wrapping around the second semiconductor layers and a gate electrode wrapping around the gate dielectric layer. In some embodiments, the method further includes removing the gate spacers and partially removing the gate dielectric layer to form openings, and forming a seal layer over the gate structure and on sidewalls of the contact etch stop layer to seal the openings to form air spacers between the contact etch stop layer and the gate structure.

In some embodiments, the seal layer extends between the gate electrode and the contact etch stop layer, In some embodiments, portions of the gate dielectric layer remain on sidewalls of the gate electrode after removing the gate spacers and partially removing the gate dielectric layer.

In some embodiments, portions of the gate dielectric layer between the gate electrode and a topmost surface of the nanostructures are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a first source/drain feature and a second source/drain feature over the substrate;
    semiconductor layers vertically stacked over each other, wherein the semiconductor layers connect the first source/drain feature to the second source/drain feature;
    a gate structure wrapping around the semiconductor layers, wherein the gate structure comprises a gate dielectric layer and a gate electrode wrapping around the gate dielectric layer;
    a contact etch stop layer over the first source/drain feature and the second source/drain feature; and
    a seal layer over the gate structure and on sidewalls of the contact etch stop layer, wherein voids are formed between the seal layer and the semiconductor layers, wherein a portion of the voids is sandwiched between a bottom surface of the gate electrode and a top surface of the semiconductor layers.

2. The semiconductor structure of claim 1, wherein a width of the gate dielectric layer over the semiconductor layers is smaller than a width of the gate electrode.

3. A semiconductor structure, comprising:
    a substrate;
    semiconductor layers over the substrate;
    a gate structure wrapping around the semiconductor layers, wherein the gate structure comprises a gate dielectric layer and a gate electrode wrapping around the gate dielectric layer;
    a source/drain feature in contact with the semiconductor layers;
    a contact etch stop layer over the source/drain feature, wherein the contact etch stop layer is separated from the gate structure by an air spacer, wherein a topmost width of the air spacer is different from a bottommost width of the air spacer, wherein a portion of the air spacer is vertically overlapped with the gate structure; and
    a seal layer over the air spacer and the gate structure, and on a sidewall of the contact etch stop layer.

4. The semiconductor structure of claim 3, wherein the seal layer extends between the gate electrode and the contact etch stop layer.

5. The semiconductor structure of claim 3, wherein a bottommost surface of the seal layer is aligned with a top surface of the gate electrode.

6. The semiconductor structure of claim 3, wherein the air spacer extends between the gate electrode and a topmost surface of the semiconductor layers.

7. The semiconductor structure of claim 3, wherein the gate electrode has a trapezoidal top portion.

8. A semiconductor structure, comprising:
    a substrate;
    semiconductor layers over the substrate;
    source/drain features in contact with the semiconductor layers;
    a gate structure wrapping around the semiconductor layers, wherein the gate structure comprises a gate dielectric layer and a gate electrode, wherein a width of a topmost surface of the gate electrode is greater than a width of an interface between a bottom surface of the gate electrode and a topmost surface of the gate dielectric layer;
    a contact etch stop layer over the source/drain features;
    a seal layer over the gate structure and on sidewalls of the contact etch stop layer; and
    voids between the seal layer and the semiconductor layers and between the gate structure and the contact etch stop layer, wherein the voids partially expose sidewalls of the source/drain features.

9. The semiconductor structure of claim 8, wherein the seal layer extends between the gate structure and the contact etch stop layer.

10. The semiconductor structure of claim 8, wherein
    the gate dielectric layer wrapping around the semiconductor layers, wherein the gate electrode wrapping around the gate dielectric layer, and the gate electrode has a trapezoidal top portion in contact with the seal layer.

11. The semiconductor structure of claim 8, wherein top surfaces of the voids are aligned with a top surface of the gate structure.

12. The semiconductor structure of claim 1, wherein the voids are in contact with the bottom surface of the gate electrode.

13. The semiconductor structure of claim 3, wherein the topmost width of the air spacer is greater than the bottommost width of the air spacer.

14. The semiconductor structure of claim 3, wherein the topmost width of the air spacer is less than the bottommost width of the air spacer.

15. The semiconductor structure of claim 3, wherein the portion of the air spacer exposes a portion of a bottom surface of the gate electrode.

16. The semiconductor structure of claim 3, wherein the portion of the air spacer is wrapped by a bottom surface of the gate electrode, a sidewall of the gate dielectric layer and a top surface of the semiconductor layers.

17. The semiconductor structure of claim 3, wherein the air spacer has a L-shape profile.

18. The semiconductor structure of claim 3, wherein the portion of the air spacer is sandwiched between a bottom surface of the gate electrode and a top surface of the semiconductor layers.

19. The semiconductor structure of claim 3, wherein a width of a bottom surface of the gate electrode is greater than a width of an interface between the bottom surface of the gate electrode and a topmost surface of the gate dielectric layer.

20. The semiconductor structure of claim 3, wherein a width of a topmost surface of the gate electrode is greater than a width of an interface between a bottom surface of the gate electrode and a topmost surface of the gate dielectric layer.

* * * * *